(12) United States Patent
Nakatsu et al.

(10) Patent No.: US 7,504,720 B2
(45) Date of Patent: Mar. 17, 2009

(54) SEMICONDUCTOR UNIT, AND POWER CONVERSION SYSTEM AND ON-VEHICLE ELECTRICAL SYSTEM USING THE SAME

(75) Inventors: Kinya Nakatsu, Hitachinaka (JP); Hideki Miyazaki, Hitachi (JP); Yoshitaka Takezawa, Hitachinaka (JP); Toshiaki Ishii, Hitachi (JP); Hiroshi Hozoji, Hitachiohta (JP)

(73) Assignee: Hitachi, Ltd., Tokyo (JP)

( * ) Notice: Subject to any disclaimer, the term of this patent is extended or adjusted under 35 U.S.C. 154(b) by 77 days.

(21) Appl. No.: 11/505,467

(22) Filed: Aug. 17, 2006

(65) Prior Publication Data
US 2007/0096278 A1    May 3, 2007

(30) Foreign Application Priority Data
Aug. 19, 2005    (JP) .............................. 2005-238497

(51) Int. Cl.
*H01L 23/34* (2006.01)
(52) U.S. Cl. .................. 257/712; 257/714; 257/718
(58) Field of Classification Search ............... 257/712, 257/714, 718
See application file for complete search history.

(56) References Cited
U.S. PATENT DOCUMENTS

| | | | | |
|---|---|---|---|---|
| 5,719,444 A | * | 2/1998 | Tilton et al. | ................ 257/714 |
| 5,804,873 A | * | 9/1998 | Pelly | ............................ 257/675 |
| 6,697,257 B1 | | 2/2004 | Wolf et al. | |
| 7,009,842 B2 | * | 3/2006 | Tilton et al. | .................. 361/699 |

FOREIGN PATENT DOCUMENTS

| | | |
|---|---|---|
| JP | A 2000-091485 | 3/2000 |
| JP | A 2001-320005 | 11/2001 |
| JP | A 2001-352023 | 12/2001 |
| JP | A 2002-026215 | 1/2002 |
| JP | A 2003-511864 | 3/2003 |
| JP | A 2003-338592 | 11/2003 |
| JP | A 2004-119667 | 4/2004 |
| JP | A 2004-241477 | 8/2004 |
| JP | A 2004-296663 | 10/2004 |
| WO | WO 01/27997 | 4/2001 |

* cited by examiner

*Primary Examiner*—Roy K Potter
(74) *Attorney, Agent, or Firm*—Crowell & Moring LLP

(57) ABSTRACT

A semiconductor device includes a semiconductor chip and leads electrically connected to the electrodes of the semiconductor chip. A hollow radiator base houses the semiconductor device which is molded with high-thermal-conductivity resin having an electrical insulating property. The radiator base has a cooling-medium channel therein or radiating fins on the outside. Alternatively, the radiator base is housed in a second radiator base.

18 Claims, 25 Drawing Sheets

SEMICONDUCTOR UNIT, AND POWER CONVERSION SYSTEM AND ON-VEHICLE ELECTRICAL SYSTEM USING THE SAME

BACKGROUND OF THE INVENTION

1. Field of the Invention

The present invention relates to a semiconductor unit, and a power conversion system and an on-vehicle electrical system using the same.

2. Description of the Related Art

For semiconductor devices, particularly, for power semiconductor devices that switch large currents, double-side cooling semiconductor unites that cool the power semiconductor devices from both sides are being contemplated because of the high heating values. The performance needed to cool semiconductor devices depends on the environments of electrical systems to which an electric circuit module equipped with the semiconductor devices is to be mounted. For example, power conversion systems for vehicles require high performance to cool the electrical systems because of the on-vehicle environment and operating environment.

An example of conventional double-side cooling semiconductor units is disclosed in JP-A-2004-296663, which is constructed of a first radiator of H-shaped cross section, first and second semiconductor devices disposed in first and second recesses of the H-shaped first radiator, respectively, and second and third radiators mounted to the upper surfaces of the first and second semiconductor devices, respectively. Thus, the lower surfaces of the semiconductor devices radiate heat from the first radiator, while the upper surfaces of the semiconductor devices radiate heat from the second and third radiators to enable double-side cooling.

SUMMARY OF THE INVENTION

The recent challenge of electrical systems equipped with an electrical circuit module having semiconductor devices is to achieve more compact, lower-cost, and higher-reliability systems. For example, the important challenge of cars is to achieve more compact, lower-cost, and higher-reliability electrical systems equipped with an electrical circuit module having semiconductor devices. In other words, cars require further reduction in influence on global environment and fuel expense. To achieve it, the widespread use of electrically powered vehicles and their auxiliary equipment is essential. To that end, it is absolutely necessary to improve the vehicle mountability of the power conversion system and to reduce the price of the power conversion system. Therefore, reduction in the size and cost and improvement in the reliability of the power conversion system is an awaiting solution of cars.

In electrical systems whose electrical circuit module is constructed of semiconductor devices that self-heat when energized, heat capacity is increased with a decrease in size. Accordingly, to reduce the size and cost of the electrical systems and to achieve high reliability, it is necessary to further improve the cooling performance of the semiconductor unit.

The semiconductor unit disclosed in JP-A-2004-296663 tries to improve the semiconductor-device cooling performance with the double-side cooling structure. On the other hand, in actual cooling of semiconductor devices, it is necessary to use a radiator mechanism for exchanging heat between the semiconductor devices and the cooling medium to radiate the heat of the semiconductor devices to the cooling medium. In this respect, the device described in JP-A-2004-296663 disclosed the structure of the semiconductor devices themselves, but does not disclose the thermal connection and electrical insulation between the semiconductor devices and the radiator mechanism.

With the semiconductor unit of JP-A-2004-296663 in which semiconductor devices are mounted in the recess of an H-shaped first radiator and second and third radiators are mounted on the top of the semiconductor devices, the upper surface of the second radiator and the upper surface of the third radiator are not always parallel with each other. This is because the solder or brazing material for use in mounting the semiconductor devices in the recess of the first radiator and the solder or brazing material for use in mounting the second and third radiators to the upper surface of the semiconductor devices are not uniform in thickness.

When the semiconductor devices are put in the radiator mechanism with low parallelism between the upper surface of the second radiator and the upper surface of the third radiator, sufficient thermal connection cannot be made between the second and third radiators of the semiconductor devices and the radiator mechanism, posing the problems of increasing heat resistance to decrease cooling performance.

Also, the semiconductor unit described in JP-A-2004-296663 is constructed such that the first radiator is electrically connected to a first lead terminal and the second or third radiator electrically connects to a second lead terminal, so that it is necessary to provide electrical isolation between the semiconductor devices and the electrically conductive radiator mechanism.

Accordingly, it is an object of the invention to provide a semiconductor unit in which the electrical isolation between the semiconductor devices and the radiator mechanism is improved and the thermal resistance between the semiconductor devices and the radiator mechanism is reduced to improve the cooling performance, and a power conversion system and an on-vehicle electrical system which are reduced in size and cost and increased in reliability using the semiconductor unit.

In order to achieve the above object, a semiconductor unit according to embodiments of the invention includes: a semiconductor device including a semiconductor chip and leads electrically connected to the electrodes of the semiconductor chip; and a hollow radiator base for housing the semiconductor device, and molding with high-thermal-conductivity resin having an electrical insulating property.

In order to achieve the above object, a semiconductor unit according to embodiments of the invention includes a semiconductor device and a radiator base for radiating the heat generated from the semiconductor device. The semiconductor device includes a semiconductor chip and leads electrically connected to electrodes of the semiconductor chip. The radiator base has a hollow body in which the semiconductor device can be molded with high-thermal-conductivity resin. The radiator base has a cooling-medium channel therein or radiating fins on the outside. The high-thermal-conductivity resin has an electrically insulating property.

This arrangement improves the electrical insulation between the semiconductor device and the radiator mechanism and reduces the thermal resistance between the semiconductor device and the radiator mechanism to thereby improve the cooling performance.

In order to achieve the above object, according to embodiments of the invention, a power conversion system for converting an electric power supplied from a power source to specified power and supplies it to a power receiver is provided. The system includes: a converter electrically connected between the power source and the power receiver, and converting the power supplied from the power source to specified power and supplying it to the power receiver; and a controller for controlling the operation of the converter. The converter converts power by controlling the electrical connection of an electrical device mounted to an electric-circuit module using the semiconductor unit as a switching device, the semiconductor unit including a semiconductor chip and leads electrically connected to electrodes of the semiconductor chip; and a hollow radiator base that houses the semiconductor device molded with high-thermal-conductivity resin having an electrical insulating property. The controller outputs a signal for controlling the electrical connection of the electrical device to the electric-circuit module in response to an external signal.

In order to achieve the above object, according to embodiments of the invention, an on-vehicle electrical system for generating electric power for driving a vehicle or an on-vehicle electrical device with the power of an on-vehicle power source is provided. The electrical system includes: an electrical device for generating the electric power; and a controller that controls the operation of the electrical device. The controller is a power converter that converts the power supplied from the on-vehicle power source to specified power and supplies it to the electrical device. The power converter includes: a converter electrically connected between the on-vehicle power source and the electrical device, and converting the power supplied from the on-vehicle power source to specified power and supplying it to the electrical device; and a controller that controls the operation of the converter. The converter converts power by controlling the electrical connection of an electrical device mounted to an electric-circuit module using the semiconductor unit as a switching device, the semiconductor unit including a semiconductor chip and leads electrically connected to the electrodes of the semiconductor chip; and a hollow radiator base that houses the semiconductor device molded with high-thermal-conductivity resin having an electrical insulating property. The controller outputs a signal for controlling the electrical connection of the electrical device to the electric-circuit module in response to an external signal.

With this arrangement, a more compact, lower-cost, and higher-reliability power conversion system and on-vehicle electrical system can be achieved.

This invention improves the electrical insulation between the semiconductor device and the radiator mechanism and reduces the thermal resistance between the semiconductor device and the radiator mechanism to thereby improve the cooling performance.

In addition, a more compact, lower-cost, and higher-reliability power conversion system and on-vehicle electrical system can be achieved.

DESCRIPTION OF THE PREFERRED EMBODIMENT

Embodiments of the invention will be specifically described with reference to the drawings.

The following embodiments will be described using an on-vehicle inverter whose heat-cycle and operating environment is very strict as an example of a power conversion system equipped with the semiconductor unit of the invention. The on-vehicle inverter is installed in an on-vehicle electrical system as a controller for controlling the operation of an on-vehicle motor. The on-vehicle inverter controls the operation of an on-vehicle motor in such a manner as to convert the DC power supplied from the battery of an on-vehicle power supply to specified AC power and supplies the AC power to the on-vehicle motor.

The following structure can also be applied to a power module that constitutes the power converter of a DC-DC power conversion system such as a DC-DC converter and a DC chopper or an AC-DC power conversion system.

The following structure can also be applied to the power converters of the power conversion systems mounted to industrial electrical systems such as factory motor driving systems or power conversion systems mounted to domestic electrical systems such as domestic photovoltaic power conversion systems and domestic motor driving systems.

FIGS. 1 to 13 show the structures of a semiconductor unit according to a first embodiment of the invention, an on-vehicle inverter using the semiconductor unit, and a hybrid electric vehicle using the on-vehicle inverter.

Referring to FIGS. 1 to 5, the structure of the semiconductor unit of this embodiment will be described.

Figure 1:
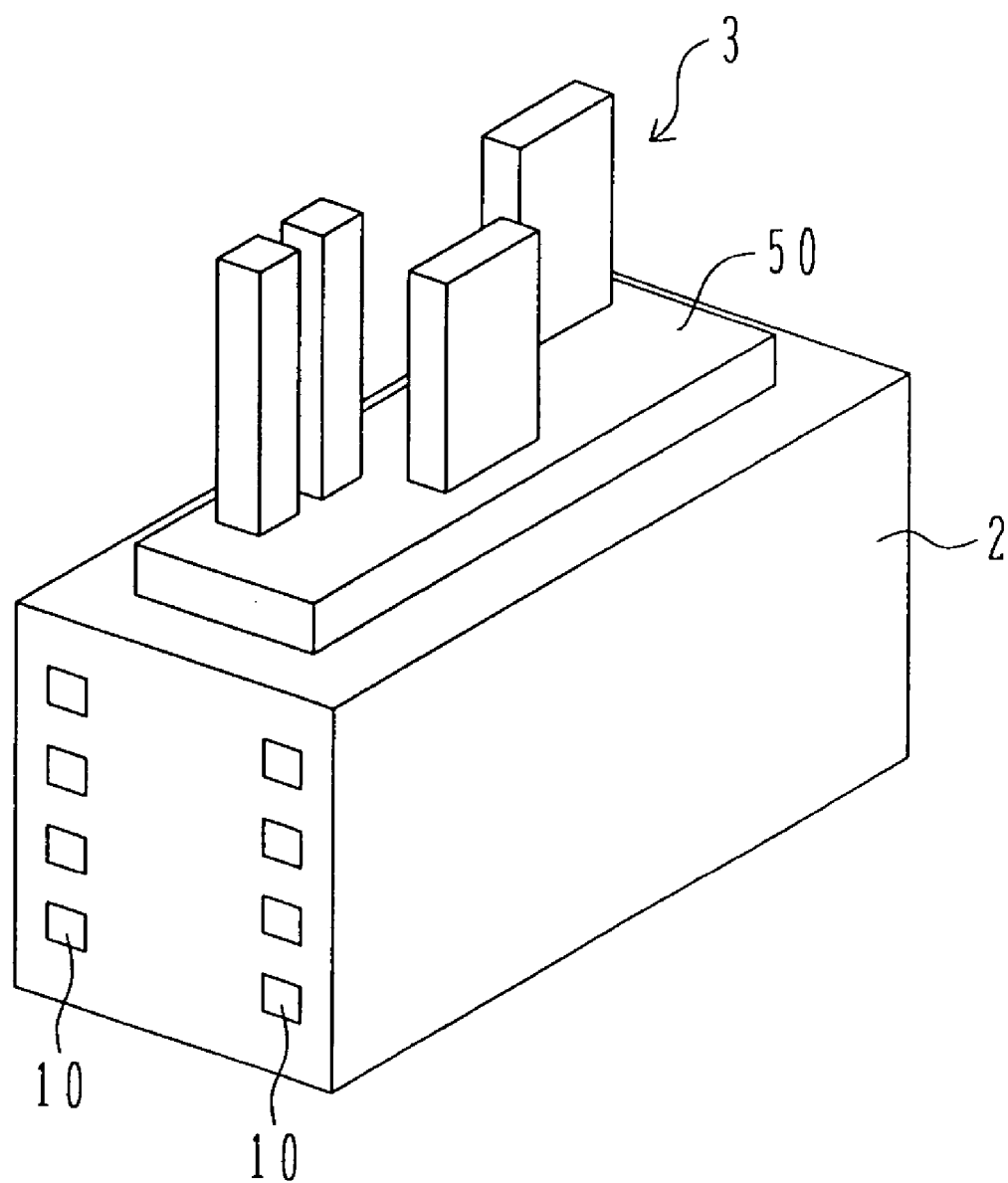
FIG. 1 is a perspective view of the semiconductor unit according to a first embodiment of the invention.
Figure 2:
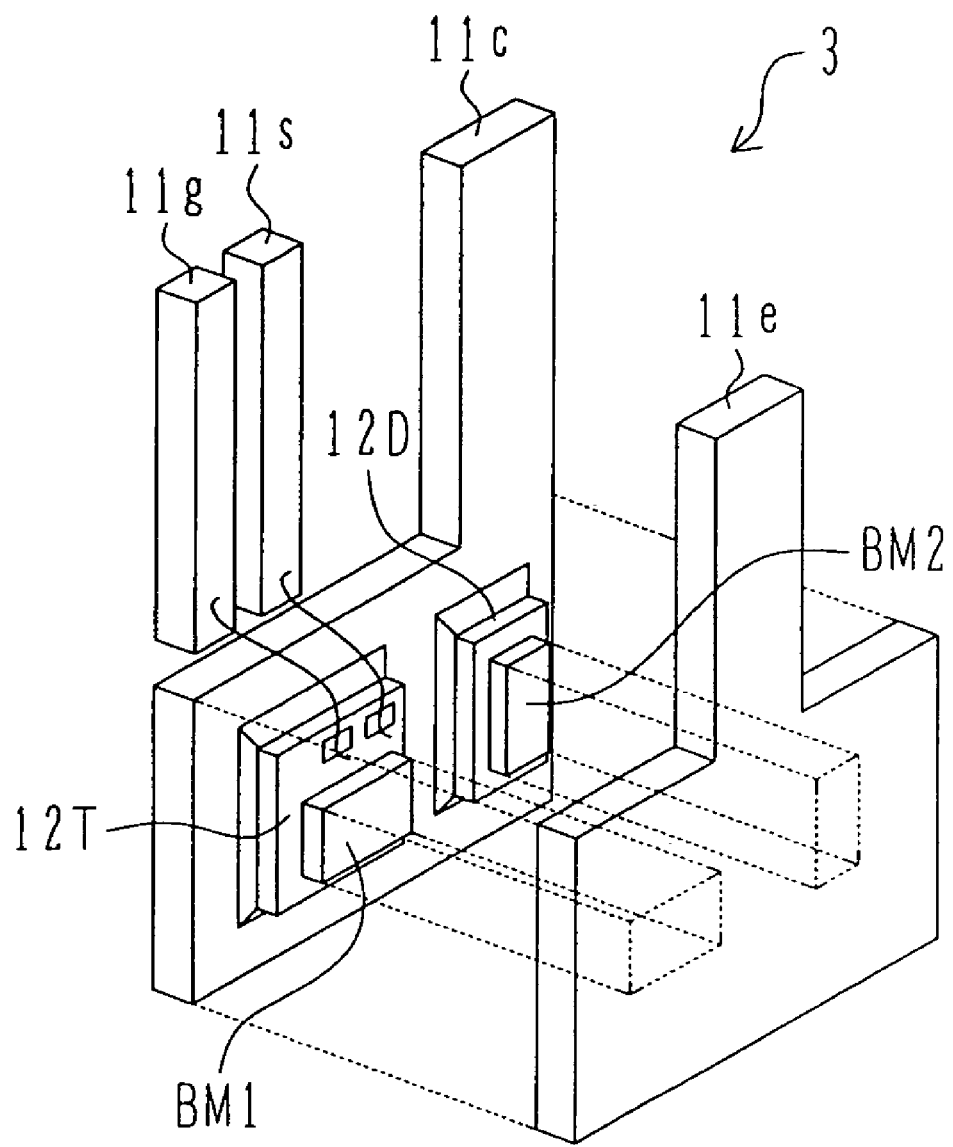
FIG. 2 is a perspective view of a semiconductor device used in the semiconductor unit according to the first embodiment.
Figure 3:
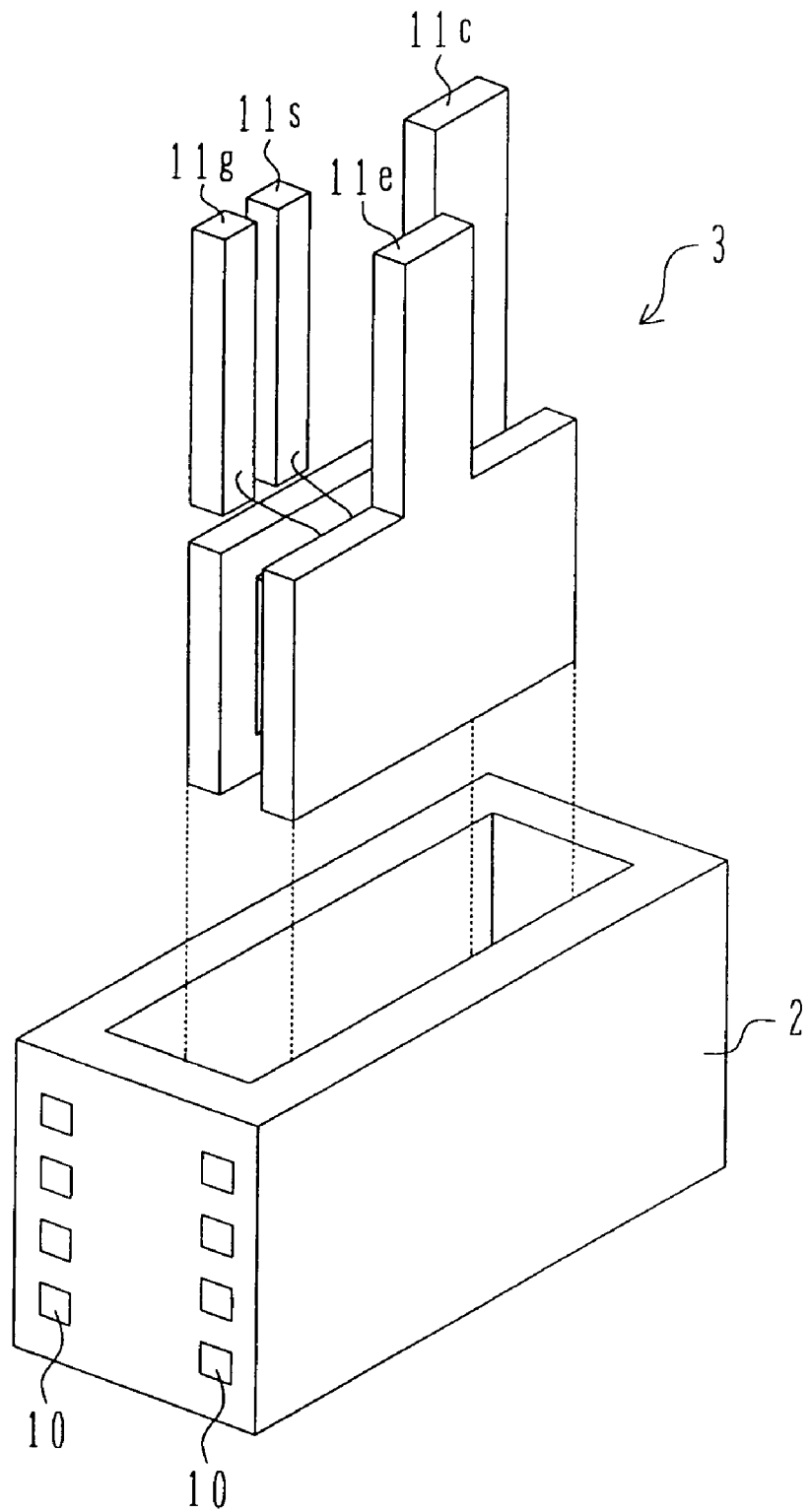
FIG. 3 is an exploded perspective view of the semiconductor unit according to the first embodiment.
Figure 4:
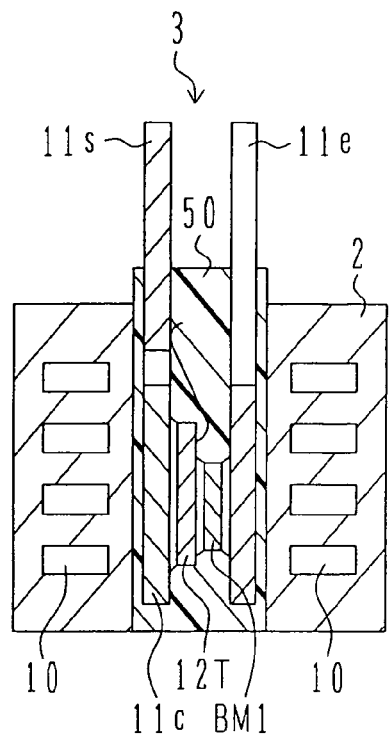
FIG. 4 is a side sectional view of the semiconductor unit according to the first embodiment.
Figure 5:
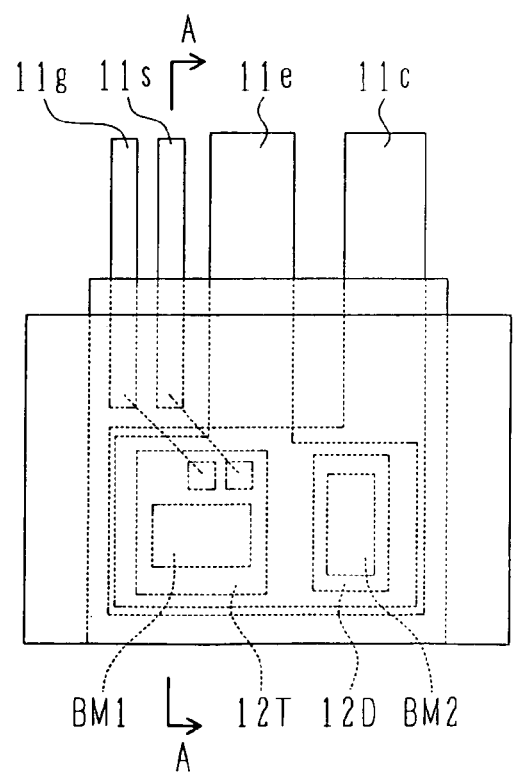
FIG. 5 is a front view of the semiconductor unit according to the first embodiment.

FIG. 1 is a perspective view of the semiconductor unit according to the first embodiment of the invention; FIG. 2 is a perspective view of a semiconductor device used in the semiconductor unit according to the first embodiment; FIG. 3 is an exploded perspective view of the semiconductor unit according to the first embodiment; FIG. 4 is a side sectional view of the semiconductor unit according to the first embodiment; and FIG. 5 is a front view of the semiconductor unit according to the first embodiment. In FIGS. 1 to 5, like elements are given like reference numerals.

Referring first to FIG. 1, the semiconductor unit of the embodiment is made up of a semiconductor device and a radiator mechanism. An example of the semiconductor device is a power semiconductor device 3. An example of the radiator mechanism is a hollow radiator base 2. The power semiconductor device 3 is molded in the hollow radiator base 2 serving as a radiator mechanism with a high-thermal-conductivity resin 50 having an electrical insulation property.

The hollow radiator base 2 is made of high-thermal-conductivity material, such as aluminum. Although copper is better from the point of view of thermal conductivity, the use of aluminum facilitates forming the hollow shape, as illustrated, by extrusion. The hollow may either have a bottom or not. Inside the hollow radiator base 2, a cooling-medium channel 10 for circulating a cooling medium is formed by extrusion.

The high-thermal-conductivity resin 50 is made of a material of electrical insulation and high thermal conductivity. One example is a mixture of epoxy resin and silica. For example, a mixture of 20 w % epoxy resin and 80 w % silica powder provides an electrical insulation property and high thermal conductivity. In place of silica, alumina, aluminum nitride, or boron nitride can be mixed in resin such as epoxy resin to improve thermal conductivity.

Referring next to FIG. 2, the structure of the power semiconductor device 3 will be described.

The back electrode of a semiconductor chip 12T constructed of an insulated-gate bipolar transistor (IGBT) and the back electrode of a semiconductor chip 12D constructed of a flywheel diode are joined on the top of a collector lead 11c by soldering. The surface electrode of the semiconductor chip 12T is joined to one surface of a buffer metal BM1 by soldering, while the other surface of the buffer metal BM1 is joined to an emitter lead 11e by soldering. The surface electrode of the semiconductor chip 12D is joined to one surface of a buffer metal BM2 by soldering, while the other surface of the buffer metal BM2 is joined to the emitter lead 11e by soldering. The buffer metals BM1 and BM2 are used to reduce thermal stress, and are made of, for example, an alloy of molybdenum and copper. The collector lead 11c and the emitter lead 11e are made of platy members because they pass large currents, and in surface connection with the semiconductor chips 12T and 12D with a bonding agent such as solder. The collector lead 11c and the emitter lead 11e are made of copper. The use of copper provides electrical conductivity and high thermal conductivity.

The gate terminal on the surface of the semiconductor chip 12T is connected to a gate lead 11g by wire bonding. A sensor terminal on the surface of the semiconductor chip 12T is connected to a sensor lead 11s by wire bonding. The gate lead 11g and the sensor lead 11s are also made of copper. The sensor terminal is used to sense the emitter potential if the semiconductor chip 12T is an IGBT.

The power semiconductor device 3 with the structure shown in FIG. 2 is inserted into the hollow radiator base 2, as shown in FIG. 3, and is positioned using a jig. Then, it is molded with the high-thermal-conductivity resin 50.

Referring then to FIGS. 4 and 5, the structure of the semiconductor unit of the embodiment will be further described. FIG. 4 shows the A-A cross-section of FIG. 5.

As shown in FIG. 4, with the power semiconductor device 3 insert-molded in the hollow radiator base 2 with the high-thermal-conductivity resin 50, the high-thermal-conductivity resin 50 is present between the collector lead 11c and the sensor lead 11s and the radiator base 2, and between the emitter lead 11e and the radiator base 2. Since the high-thermal-conductivity resin 50 has an electrical insulating property, as described above, the electrical insulation between the electrically conductive radiator base 2 and the collector lead 11c, the sensor lead 11s, and the emitter lead 11e can be ensured. The example illustrated uses a base without a bottom as the radiator base 2.

As the material of the collector lead 11c and the emitter lead 11e, an electrically conductive copper material is used. The use of copper provides high thermal conductivity to the leads. Accordingly, the heat generated from the semiconductor chip 12T of the power semiconductor device 3, which is a heat generating component, is transmitted to the radiator base 2 through the collector lead 11c and the high-thermal-conductivity resin 50 and through the buffer metal BM1, the emitter lead 11e, and the high-thermal-conductivity resin 50, and is exchanged with the cooling medium flowing through a cooling-medium channel 10 formed in the radiator base 2 to be radiated to the exterior.

As has been described, the semiconductor unit of the embodiment is constructed such that the power semiconductor device 3 is inserted into the hollow radiator base 2, is positioned, and is then molded with the high-thermal-conductivity resin 50. Therefore, even if the parallelism between the collector lead 11c and the emitter lead 11e is decreased owing to variations in the thickness of the solder layer used for joining the collector lead 11c to the back electrode of the semiconductor chip 12T constructed of an IGBT element, variations in the thickness of the solder layer used for joining the surface electrode of the semiconductor chip 12T to one surface of the buffer metal BM1, and variations in the thickness of the solder layer used for joining the other surface of the buffer metal BM1 to the emitter lead 11e, the heat generated from the power semiconductor device 3 can be transmitted to the radiator base 2 via the high-thermal-conductivity resin 50, because the power semiconductor device 3 is insert-molded in the radiator base 2 with the high-thermal-conductivity resin 50, thus improving the cooling performance.

Figure 6:
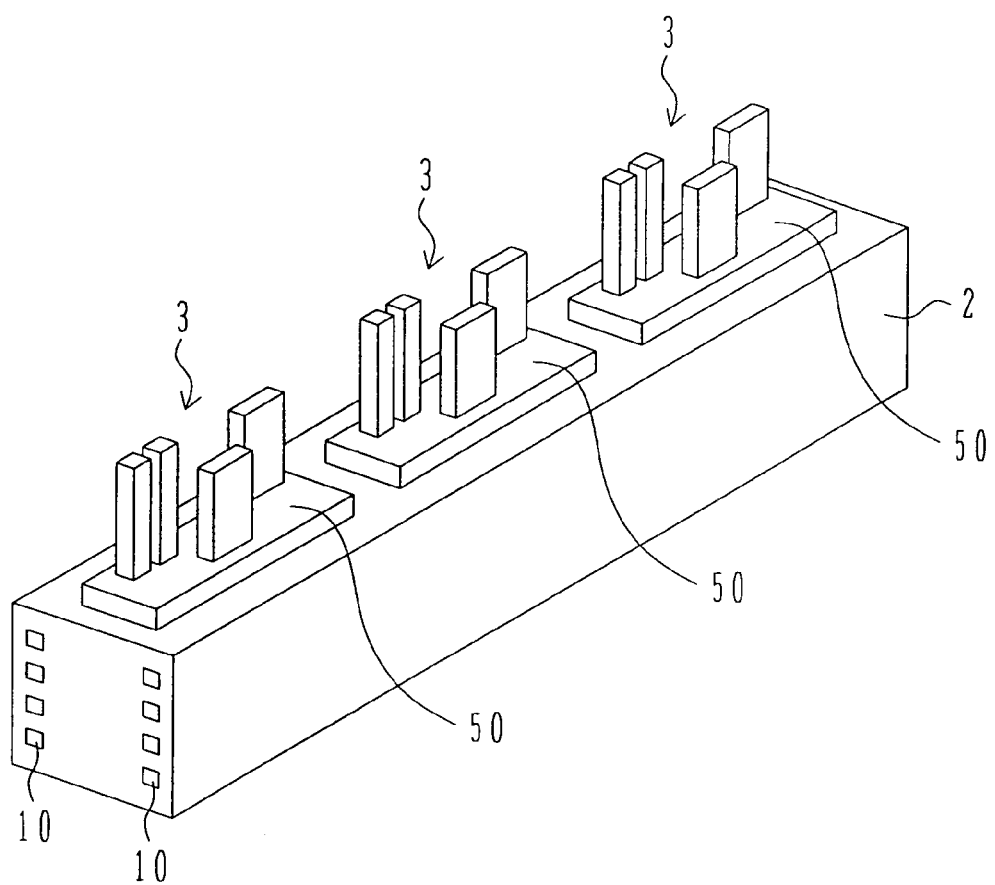
FIG. 6 is a perspective view showing another structure of the semiconductor unit according to the first embodiment.

Referring now to FIG. 6, another structure of the semiconductor unit according to the first embodiment will be described.

FIG. 6 is a perspective view showing another structure of the semiconductor unit according to the first embodiment. The same numerals as those of FIG. 1 indicate the same components.

In the example of FIG. 6, a plurality of (in this example, three) power semiconductor devices 3 is longitudinally arranged in series in the hollow radiator base 2, which is secured with the high-thermal-conductivity resin 50.

Figure 7:
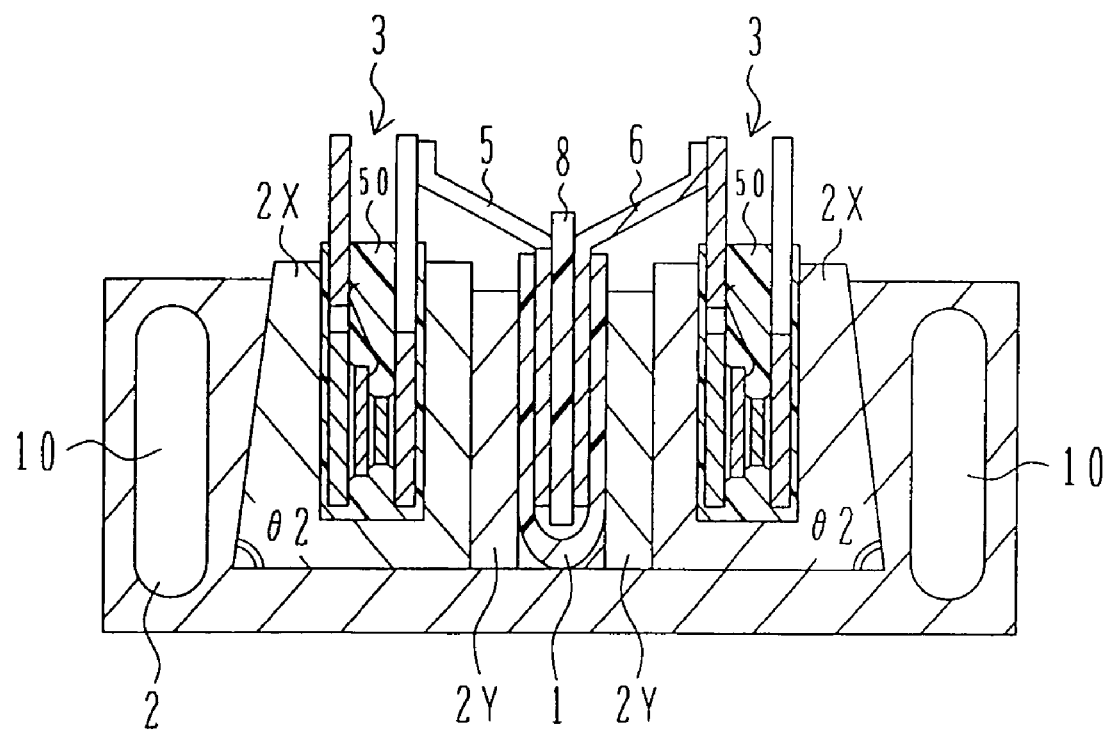
FIG. 7 is a sectional view showing another structure of the semiconductor unit according to the first embodiment.

Referring next to FIG. 7, another structure of the semiconductor unit according to the first embodiment will be described.

FIG. 7 is a sectional view showing another structure of the semiconductor unit according to the first embodiment. The same numerals as those of FIG. 1 indicate the same components.

In the example of FIG. 6, three power semiconductor devices 3 are insert-molded in the hollow radiator base 2 with the high-thermal-conductivity resin 50, while an on-vehicle inverter uses six power semiconductor devices 3. Specifically, the inverter converts DC power to three-phase AC power. Therefore, the inverter requires an upper-arm power semiconductor device 3 and a lower-arm power semiconductor device 3 for each of the three phases, u phase, v phase, and w phase, resulting in using six power semiconductor devices 3 in total.

In that case, three power semiconductor devices 3 are arranged, as shown in FIG. 6, and two power semiconductor devices 3 are arranged in the direction perpendicular thereto. Thus, the six power semiconductor devices 3 can be insert-molded in the radiator base 2 with the high-thermal-conductivity resin 50.

FIG. 7 shows the arrangement of two power semiconductor devices 3, in the center of which an electrically conductive platy bus bar is disposed to feed power to the leads of the power semiconductor devices 3. In other words, a DC negative-electrode-side wiring member 5 and a DC positive-electrode-side wiring member 6 are bus-bar conductors made of high-electrical-conductivity metal, such as copper. Between the DC negative-electrode-side wiring member 5 and the DC positive-electrode-side wiring member 6, an elastic member 8 having an electrically insulating property, such as insulating rubber, is sandwiched, and is placed in a U-shape-cross-section insulating first fixing jig 1.

The power semiconductor devices 3 are respectively housed in first radiator bases 2X, and are insert-molded with the high-thermal-conductivity resin 50. The angle θ2 formed by a first side and the bottom of the first radiator base 2X is set smaller than 90°, for example, 85°.

Since the angle of the side with respect to the inner bottom of the second radiator base 2 is also set at angle θ2, the first radiator bases 2X can be in contact with the bottom of the second radiator base 2 and the first side. On second sides of the first radiator bases 2X, high-thermal-conductivity pressing members 2Y made of aluminum or the like, as well as the radiator base 2, are disposed. Between the pressing members 2Y, the electrically conductive platy bus bar is disposed to feed power to the leads of the power semiconductor device 3. The elasticity of the elastic member 8 brings the pressing members 2Y into contact with the first radiator bases 2X and to bring the first radiator bases 2X into contact with the second radiator base 2. The setting of the angle θ2 smaller than 90° facilitates bringing the first radiator bases 2X into contact with the second radiator base 2 to retain it there only by the elasticity of the elastic member 8.

Thus, even if the parallelism of the collector lead 11c and the emitter lead 11e of the power semiconductor device 3 is low, the heat generated from the semiconductor chip 12T can be transmitted through the first radiator bases 2X to the second radiator base 2 via the high-thermal-conductivity resin 50 to be cooled by the cooling medium flowing through the cooling-medium channel 10.

Referring next to FIGS. 8 to 11, the structure of an on-vehicle inverter INV that uses the semiconductor unit of the embodiment will be described. The cross section of the semiconductor unit used in the inverter INV according to the embodiment is shown in FIG. 7.

Figure 8:
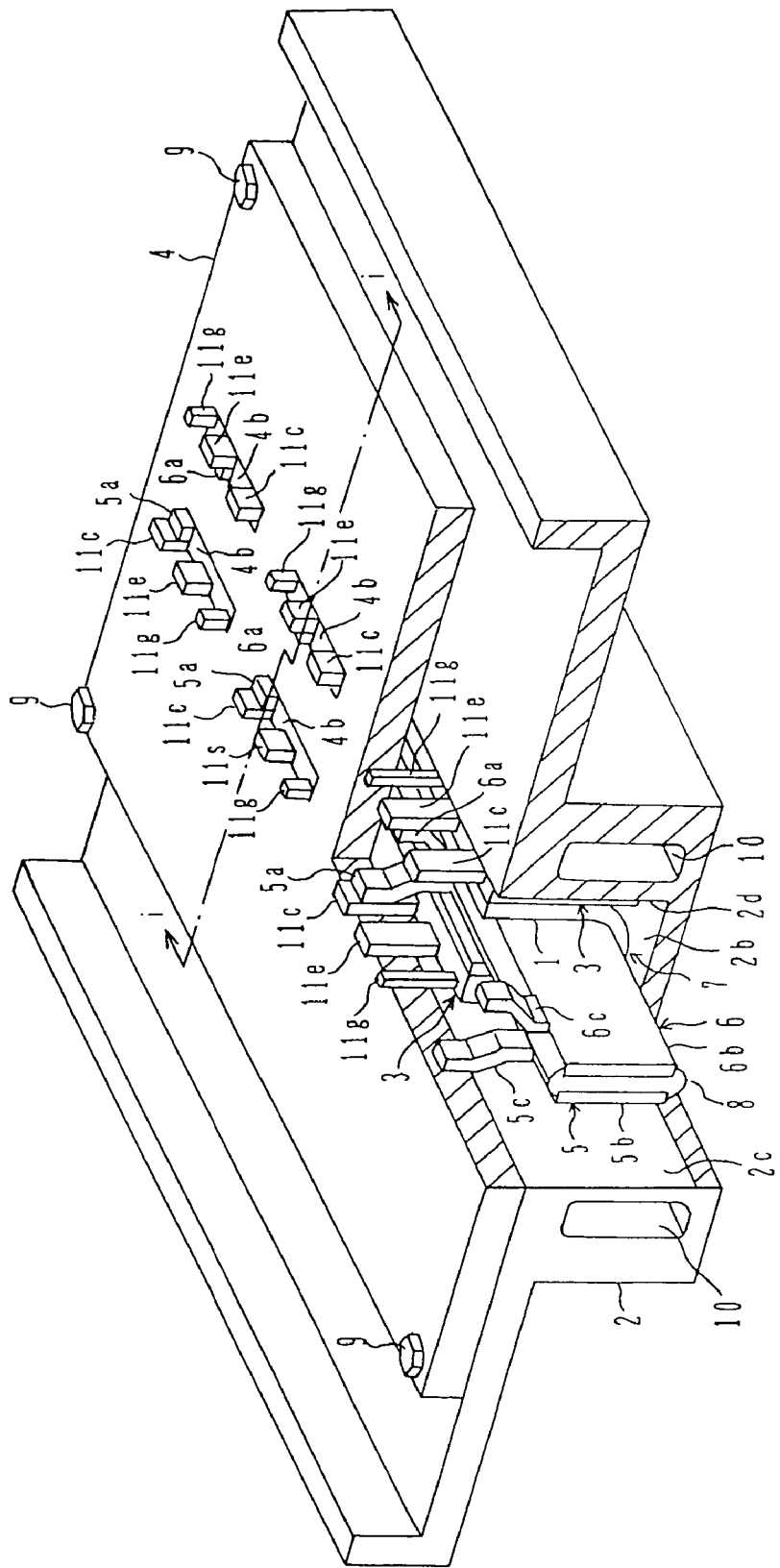
FIG. 8 is a perspective view, fragmentarily in cross section, of an on-vehicle inverter using the semiconductor unit according to the first embodiment of the invention.
Figure 9:
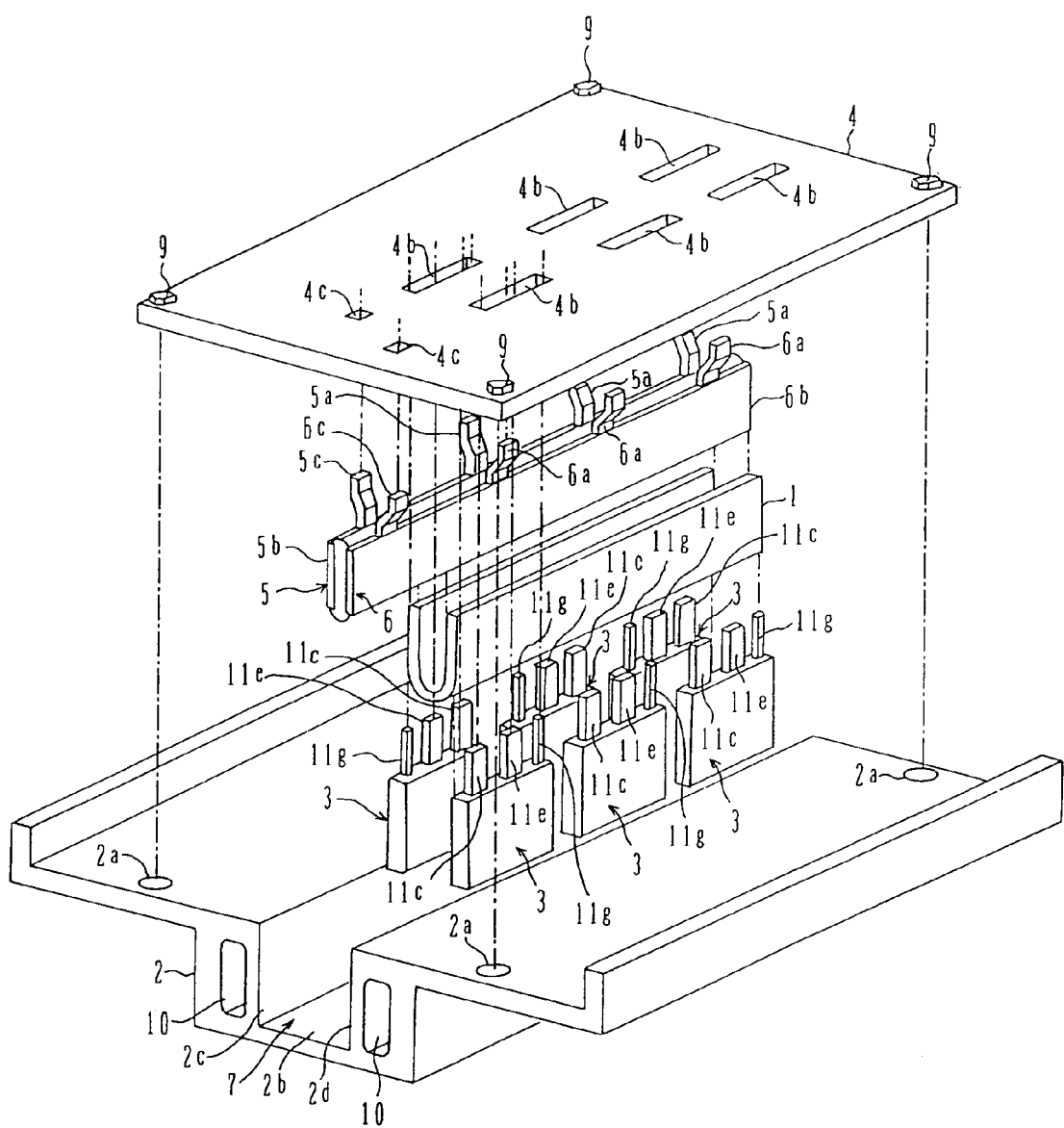
FIG. 9 is an exploded perspective view of the on-vehicle inverter using the semiconductor unit according to the first embodiment.
Figure 10:
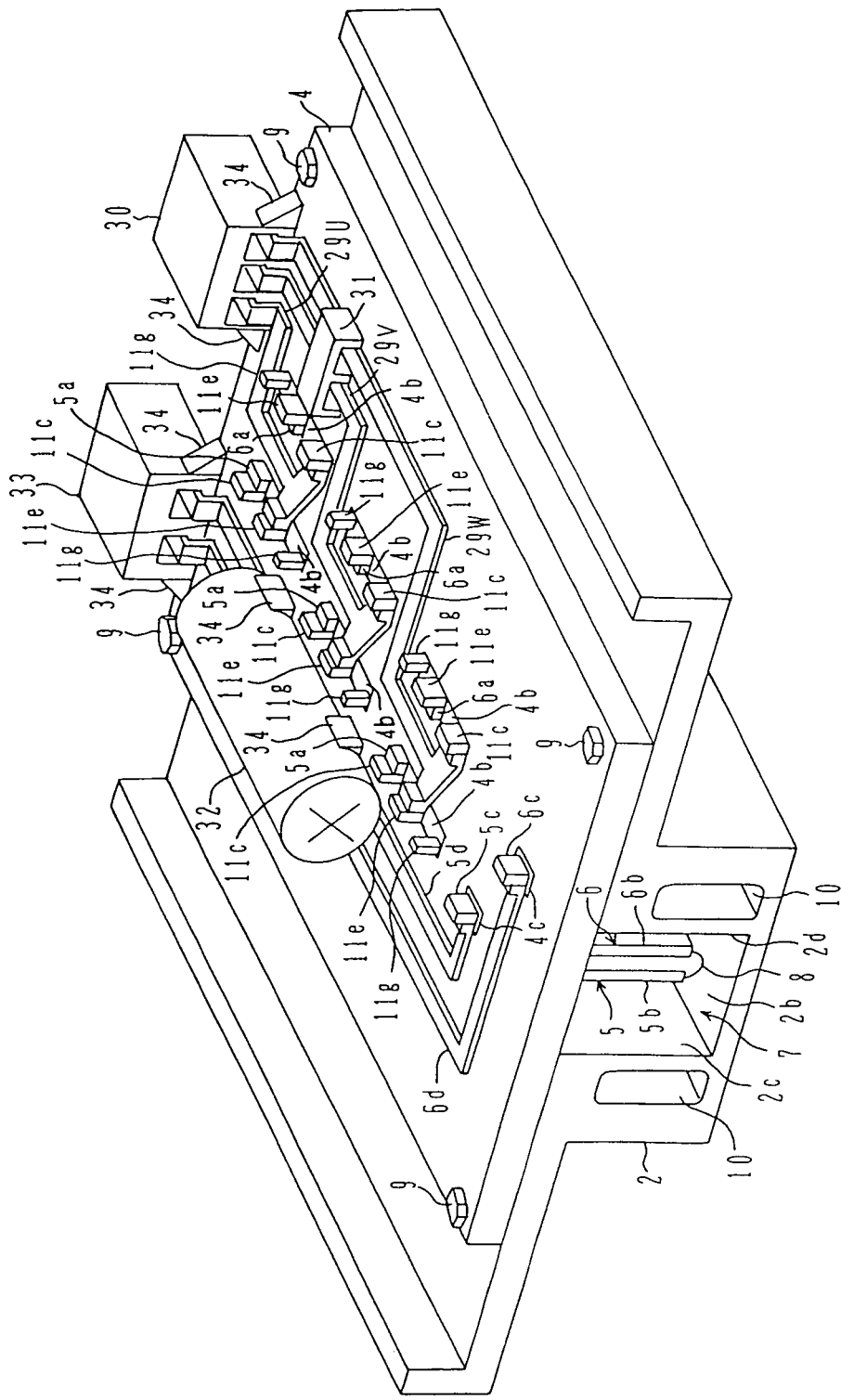
FIG. 10 is a perspective view of the on-vehicle inverter using the semiconductor unit according to the first embodiment.
Figure 11:
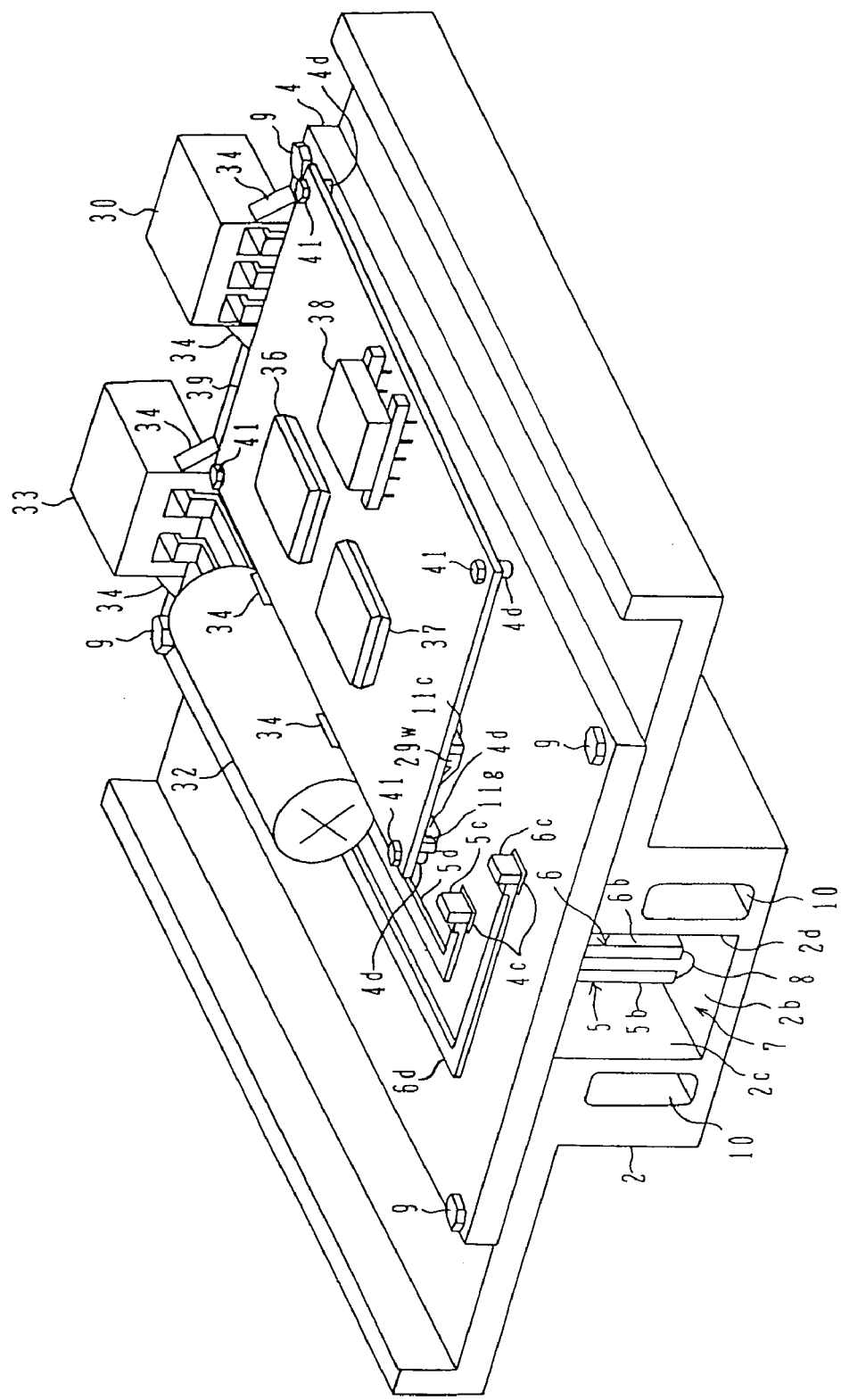
FIG. 11 is a perspective view of the on-vehicle inverter using the semiconductor unit according to the first embodiment.

FIG. 8 is a perspective view, fragmentarily in cross section, of the on-vehicle inverter INV using the semiconductor unit according to the first embodiment of the invention; FIG. 9 is an exploded perspective view of the on-vehicle inverter INV using the semiconductor unit according to the first embodiment; and FIGS. 10 and 11 are perspective views of the on-vehicle inverter INV using the semiconductor unit according to the first embodiment.

The radiator base 2 is a radiator made of metal (high-thermal-conductivity metal such as aluminum), as shown in FIGS. 8 to 11 in which a rectangular parallelepiped main body whose dimensional relationship is length>width>height and a crank-shaped flange projecting from the tops of the opposite sides of the main body in the lateral direction to the opposite directions in the longitudinal direction. The radiator base 2 is formed in such a manner that a metal material is extruded, molded, or cut out. The flange is integrally formed of a flat plate on the tops of the laterally opposite sides of the main body and an erect portion that erects upward at a right angle from the top of the lateral ends of the flat plate (the ends opposite to the main body). The length of the flat plate of the flange is equal to the length of the main body.

Here, the longitudinal direction denotes the direction of the length of the main body of the radiator base 2, while the lateral direction denotes the direction of the width of the main body of the radiator base 2 when the rectangular parallelepiped main body of the radiator base 2 has the relationship of length>width>height. This is also applied to the following description. In the following description, the term, height, indicates the height of the main body of the radiator base 2 when the rectangular parallelepiped main body of the radiator base 2 has the relationship of length>width>height.

A recess 7 is formed in the center of the short side of the main body of the radiator base 2. The recess 7 is a groove formed by two sidewalls 2c and 2d that close the opposite sides in the lateral direction and a bottom wall 2b that closes the bottom in such a manner as to passes through in the longitudinal direction and is open to the top. The sidewalls 2c and 2d on the opposite sides of the recess 7 in the lateral direction each have the cooling-medium channel 10 adjacent to the recess 7. The cooling-medium channel 10 is a passage for a liquid cooling medium such as cooling water to pass through, which is a rectangular-cross-section hole passing through in the longitudinal direction. The sidewalls 2c and 2d and the bottom wall 2b extend in parallel in the longitudinal direction along the cooling-medium channel 10.

Three power semiconductor devices 3 that constitute the upper arms are arranged in line in the longitudinal direction, as shown in FIG. 6, such that first leads of the power semiconductor device 3 are in surface contact with the surface of the sidewall 2c of the recess 7 with the high-thermal-conductivity resin 50 therebetween. Three power semiconductor devices 3 that constitute the lower arms are arranged in line in the longitudinal direction such that second leads of the power semiconductor device 3 are in surface contact with the surface of the sidewall 2d of the recess 7 with the high-thermal-conductivity resin 50 therebetween. The power semiconductor devices 3 that constitute the in-phase arms are opposed in the lateral direction, as shown in FIG. 7. With this arrangement, one side of the power semiconductor device 3 (opposite to the side that the leads 11c, 11e, and 11g extend) is in surface contact with the surface of the bottom wall 2b with the high-thermal-conductivity resin 50 therebetween, and erects therefrom so that the leads 11c, 11e, and 11g extend upward. The illustration of the lead 11s is omitted here.

The first fixing jig 1 is disposed on the side of the power semiconductor device 3 opposite to the sidewalls 2c and 2d. The first fixing jig 1 is a platy-clip-like member having pressing portions 5b and 6b and a connecting portion, which is a resin mold formed by die-casting in such a manner as to extend along the length of the recess 7 and has a U-shaped longitudinal cross section. The pressing portions 5b and 6b are rectangular flat plates, whose surfaces adjacent to the sidewalls 2c and 2d are in contact with the surfaces of the power semiconductor device 3 opposite to the sidewalls 2c and 2d, and face in the lateral direction. The connecting portion is a part curved to the bottom wall 2b and connecting the two pressing portions 5b and 6b, whose peak is in contact with the bottom wall 2b. The first fixing jig 1 is made of electrically insulating resin in which inorganic powder filler or glass fibers represented by glass or silica is mixed. The embodiment in which the first fixing jig 1 is made of such resin intends to increase the strength and thermal resistance of the first fixing jig 1.

A pressing jig is disposed on the side of the pressing portions of the first fixing jig 1 opposite to the power semiconductor device 3 in such a manner as to be sandwiched between the pressing portions. The pressing jig is a layer of the electrically insulating elastic member 8 and the DC negative-electrode-side wiring member 5 and the DC positive-electrode-side wiring member 6 that sandwich the elastic member 8 from both sides in the lateral direction.

The elastic member 8 is in the form of sheet made of rubber or silicone resin having high heat resistance. The silicone resin is best suited as the elastic member for modules because it has electrical insulation, extremely small compression permanent deformation, and high elasticity even under high-temperature environment.

First connecting portions 5a are lead-side conductive plate members formed on the upper part of the pressing portion 5b (the open side of the recess 7), which are disposed at intervals in the longitudinal direction so as to correspond to the leads 11c of the in-phase power semiconductor devices 3 of the upper arms. First connecting portions 6a are lead-side conductive plate members formed on the upper part of the pressing portion 6b (the open side of the recess 7), which are disposed at intervals in the longitudinal direction so as to correspond to the leads 11e of the in-phase power semiconductor devices 3 of the lower arms. The first connecting portions 5a and 6a are drawn in a line from the inside of the recess 7 to the outside, pass through through-holes 4b of a second fixing jig 4, to be described later, and are then bent toward the corresponding leads of the power semiconductor device 3. The leading ends of the first connecting portions 5a and 6a are in surface contact with the corresponding leads and joined thereto by welding or the like. Since the first connecting portion 5a and the first connecting portion 6a are connected to different leads, they are displaced in the longitudinal direction.

Second connecting portions 5c and 6c are terminal-side conductive plate members formed on the upper part of the pressing portions 5b and 6b (the open side of the recess 7) and at first ends of the pressing portions 5b and 6b in the longitudinal direction (in this embodiment, the end opposite to a DC terminal 33 and an AC terminal 30, to be described later). The second connection portions 5c and 6c are, as are the first connecting portions 5a and 6a, drawn in a line from the inside of the recess 7 to the outside, pass through through-holes 4c of the second fixing jig 4, to be described later, and are then bent in the same direction as the first connecting portions 5a and 6a. Since the second connecting portion 5c and the second connecting portion 6c are connected to leads on the same plane, they are displaced in the longitudinal direction.

The part of the retaining portion of the elastic member 8 (the side from which the first connecting portions 5a and 6a and the second connecting portions 5c and 6c are drawn) which overlaps with the first connecting portions 5a and 6a and the second connecting portions 5c and 6c is cut off according to the plate width and thickness of the overlapped portions.

The longitudinal displacement of the first connecting portions 5a and 6a and the second connecting portions 5c and 6c provides a creepage distance between the first connecting portions 5a and 6a and a creepage distance between the second connecting portions 5c and 6c, so that there is no need to dispose an insulator between the first connecting portions 5a and 6a and between the second connecting portions 5c and 6c. However, if the lateral thickness of the elastic member 8 is decreased than now or if the voltage applied to the first connecting portions 5a and 6a and the second connecting portions 5c and 6c is increased than now, there is the need to dispose an insulator between the first connecting portions 5a and 6a and between the second connecting portions 5c and 6c. In this case, the elastic member 8 needs only to have an heightwise extending portion in such a manner that part of the elastic member 8 is disposed between the first connecting portions 5a and 6a and between the second connecting portions 5c and 6c.

The longitudinal dimensional relationship among the recess 7, the first fixing jig 1, and the pressing jig (the elastic member 8, the DC negative-electrode-side wiring member 5, and the DC positive-electrode-side wiring member 6) is expressed as the recess 7>the pressing jig>the first fixing jig 1.

A second fixing jig 4 is disposed on the top of the radiator base 2, with the power semiconductor devices 3, the first fixing jig 1, and the pressing jig housed in the recess 7. The second fixing jig 4 is a plate member that prevents the power semiconductor devices 3, the first fixing jig 1, and the pressing jig from coming out of engagement from the recess 7 and fixes the leads 11c, 11e, and 11g of the power semiconductor devices 3 and the first connecting portions 5a and 6a and the second connecting portions 5c and 6c of the DC negative-electrode-side wiring member 5 and the DC positive-electrode-side wiring member 6. The second fixing jig 4 is fixed to the plane of the flange of the radiator base 2 with bolts 9 in such a manner as to cover the upper open portion of the recess 7, the upper surface of the main body of the radiator base 2 and part of the upper surface of the plane of the flange of the radiator base 2. The plane of the flange of the radiator base 2 has four bottomed circular holes 2a into which the bolts 9 are to be screwed.

The second fixing jig 4 has through holes 4a, 4b, and 4c and supports 4d. The through holes 4a are circular holes for the bolts 9 to pass through heightwise, which are formed at the four corners of the second fixing jig 4 in such a manner as to face the bottomed circular holes 2a. The through holes 4b are rectangular holes for the leads 11c, 11e, and 11g, the first connecting portion 5a of the DC negative-electrode-side wiring member 5, or the first connecting portion 6b of the DC positive-electrode-side wiring member 6 to collectively pass through heightwise for each power semiconductor device 3. The through holes 4b are arranged in the center of the second fixing jig 4, in the positions corresponding to the leads 11c, 11e, and 11g, and the first connecting portion 5a of the DC negative-electrode-side wiring member 5 or the fixing portion 6a of the DC positive-electrode-side wiring member 6, in such a manner that three in the longitudinal direction and two in the lateral direction in correspondence with the arrangement of the power semiconductor devices 3.

The through holes 4c are rectangular holes for the second connecting portion 5c of the DC negative-electrode-side wiring member 5 and the second connecting portion 6c of the DC positive-electrode-side wiring member 6 to pass through heightwise. The through holes 4c are disposed at the positions corresponding to the second connecting portions 5c and 6c of the DC negative-electrode-side wiring member 5 and the DC positive-electrode-side wiring member 6 and on the extension of the two longitudinally arranged through holes 4b.

Like the first fixing jig 1, the second fixing jig 4 is also molded of electrically insulating resin in which inorganic powder filler or glass fibers represented by glass or silica is mixed. The embodiment in which the second fixing jig 4 is made of such resin intends to increase the strength and thermal resistance of the second fixing jig 4, as well as the first fixing jig 1.

The second fixing jig 4 has a DC (input) circuit from a DC terminal 33 to a bridge circuit (phase arms) and an AC (output) circuit from the bridge circuit (phase arms) to the AC terminal 30. In this embodiment, the DC (input) circuit and the AC (output) circuit are configured so that DC power is input from a first longitudinal end of the second fixing jig 4 (the end opposite to the through holes 4c). The input DC power is converted to three-phase AC power through the bridge circuit, and the converted three-phase AC power is output from the first longitudinal end of the second fixing jig 4. Accordingly, this embodiment has the DC (input) circuit on a first side in the lateral direction (on the side of the upper-arm power semiconductor devices 3 with respect to the center of the width), while the AC (output) circuit on a second side in the lateral direction (on the side of the lower-arm power semiconductor devices 3 with respect to the center of the width), with the longitudinal arrangement of the through holes 4b therebetween.

The DC terminal 33 and the AC terminal 30 are provided at the longitudinal first end of the second fixing jig 4 (the end opposite to the through holes 4c) and in the positions outside the longitudinal arrangement of the through holes 4b in the center in the lateral direction in such a manner as to project from the longitudinal first end of the second fixing jig 4 to the outside in the longitudinal direction. The DC terminal 33 and the AC terminal 30 electrically connect the outside of the inverter INV and a power module unit PMU, and are each composed of terminals capable of connecting with external cables and a casing that covers the terminals.

The positive electrode (negative electrode) of the DC terminal 33 is electrically and mechanically connected to a third connecting portion 6d (5d) of the DC positive-electrode (negative-electrode)-side wiring member 6 (5). The third connecting portions 5d and 6d are planar electrically conductive member made of high-electrical-conductivity metal such as copper, whose ends opposite to the DC terminal 33 are connected to the second connecting portions 5c and 6c. The third connecting portions 5d and 6d project from the casing of the DC terminal 33, are bent to the second fixing jig 4, and extend over the surface of the second fixing jig 4 toward the longitudinal second end of the second fixing jig 4 (the end at which the through holes 4c are formed). The third connecting portions 5d and 6d are then bent at a right angle at the longitudinal second end of the second fixing jig 4 and on the surface of the second fixing jig 4 in the lateral direction, and extend toward the second connecting portions 5c and 6c. The ends of the third connecting portions 5d and 6d are face-bonded to the second connecting portions 5c and 6c by welding or the like.

The U-phase (V-phase, W-phase) of the AC terminal 30 is electrically and mechanically connected to an AC U-phase (V-phase, W-phase) wiring member 29U (29V, 29W). The AC U-phase (V-phase, W-phase) wiring member 29U (29V, 29W) is a planar electrically conductive member made of high-electrical-conductivity metal such as copper, whose end opposite to the AC terminal 30 is connected to the lead 11e of the U-phase (V-phase, W-phase) upper-arm power semiconductor device 3 and the lead 11c of the U-phase (V-phase, W-phase) lower-arm power semiconductor device 3. The AC U-phase (V-phase, W-phase) wiring member 29U (29V, 29W) projects from the casing of the AC terminal 30 and is bent toward the second fixing jig 4.

The AC U-phase wiring member 29U extends over the surface of the second fixing jig 4 in the lateral direction on the longitudinal first side of the through holes 4b for the leads 11c, 11e, and 11g of the U-phase lower-arm power semiconductor devices 3 (adjacent to the AC terminal 30) to reach between the two longitudinal rows of the through holes 4b. The AC U-phase wiring member 29U is then bent at a right angle in the longitudinal direction between the two longitudinal rows of the through holes 4b over the surface of the second fixing jig 4 to reach between the two through holes 4b. The AC U-phase wiring member 29U then branches in two directions substantially in the lateral direction (substantially in T-shape) between the two through holes 4b for the leads 11c, 11e, and 11g of the U-phase power semiconductor device 3 and over the second fixing jig 4 to extend in the lateral direction toward the lead 11e of the U-phase upper-arm power semiconductor device 3 and the lead 11c of the U-phase lower-arm power semiconductor device 3. A first end of the AC U-phase wiring member 29U is face-bonded to the lead 11e, and a second end is connected to the lead 11c by welding or the like.

The AC V-phase (W-phase) wiring member 29V (29W) extends in the longitudinal direction toward the second end (the end adjacent to the through holes 4c) over the surface of the second fixing jig 4, is bent at a right angle in the lateral direction on the surface of the second fixing jig 4, and extends in the lateral direction toward the through hole 4b. The AC V-phase (W-phase) wiring member 29V (29W) then extends in the lateral direction between the through holes 4b for the leads 11c, 11e, and 11g of the U-phase (V-phase) lower-arm power semiconductor device 3 and the through holes 4b for the leads 11c, 11e, and 11g of the V-phase (W-phase) lower-arm power semiconductor device 3 to reach between the two longitudinal rows of the through holes 4b. The AC V-phase (W-phase) wiring member 29V (29W) is then bent at a right angle in the longitudinal direction between the two longitudinal rows of the through holes 4b and over the surface of the second fixing jig 4 to reach between the two through holes 4b for the leads 11c, 11e, and 11g of the V-phase (W-phase) power semiconductor device 3. The AC V-phase (W-phase) wiring member 29V (29W) then branches in two directions substantially in the lateral direction (substantially in T-shape) between the two through holes 4b for the leads 11c, 11e, and 11g of the V-phase (W-phase) power semiconductor device 3 and over the second fixing jig 4 to extend in the lateral direction toward the lead 11e of the V-phase (W-phase) upper-arm power semiconductor device 3 and the lead 11c of the V-phase (W-phase) lower-arm power semiconductor device 3. A first end of the AC V-phase (W-phase) wiring member 29V (29W) is face-bonded to the lead 11e of the V-phase (W-phase) upper-arm power semiconductor device 3, and a second end is connected to the lead 11c of the V-phase (W-phase) lower-arm power semiconductor device 3 by welding or the like.

An electrolytic capacitor 32 is disposed right on the third connecting portions 5d and 6d. The electrolytic capacitor 32 is a columnar structure having positive and negative terminals, which extends in parallel with the length of the third connecting portions 5d and 6d and is transversely fixed to fixing portions 34 of the second fixing jig 4 with a space between it and the third connecting portions 5d and 6d. The positive terminal of the electrolytic capacitor 32 is electrically connected to the third connecting portion 5d, while the negative terminal is electrically connected to the third connecting portion 6d.

The embodiment is described for the case in which the third connecting portions 5d and 6d, the AC U-phase wiring member 29U, the AC V-phase wiring member 29V, and the AC W-phase wiring member 29W are mounted on the second fixing jig 4. Alternatively, the wiring members may be embedded in the second fixing jig 4 during forming the second fixing jig 4.

A current sensor 31 is mounted to the longitudinally extending parts of the AC V-phase wiring member 29V and the AC W-phase wiring member 29W. The current sensor 31 is a current transformer composed of a C-shaped core and a magnetic sensor (Hall element or Hall IC) disposed in the cut of the core.

The second fixing jig 4 has the fixing portions 34. The fixing portions 34 retain the DC terminal 33, the AC terminal 30, and the electrolytic capacitor 32 and are integrated with the second fixing jig 4.

Of the fixing portions 34 at four positions at the first longitudinal end of the second fixing jig 4 (the end opposite to the through holes 4c), two fixing portions 34 on one side in the lateral direction with the longitudinal rows of the through holes 4b therebetween (adjacent to the longitudinal row of the upper-arm power semiconductor devices 3 with respect to the lateral center) are in engagement with the DC terminal 33, while the fixing portions 34 on the other side (adjacent to the lower-arm power semiconductor devices 3 with respect to the lateral center) are in engagement with the AC terminal 30. The DC terminal 33 and the AC terminal 30 are placed between the fixing portions 34 from the lateral opposite sides and are fixed to the second fixing jig 4.

The embodiment has been described for the case in which the DC terminal 33 and the AC terminal 30 are fixed to the second fixing jig 4 with the fixing portions 34. Alternatively, the DC terminal 33 and the AC terminal 30 may be integrated with the second fixing jig 4.

The fixing portions 34 formed at four positions of the second fixing jig 4 along the third connecting portions 5d and 6d with the third connecting portions 5d and 6d therebetween are in engagement with the electrolytic capacitor 32. The electrolytic capacitor 32 is sandwiched by the fixing portions 34 from the lateral opposite sides, and is thus fixed to the second fixing jig 4.

The second fixing jig 4 has the supports 4d at four positions. The supports 4d each have a screw hole. On the supports 4d is provided a control circuit board 39. The control circuit board 39 is fixed to the supports 4d with screws 41. The control circuit board 39 is thus disposed on the output (AC) circuit extending from the bridge circuit to the AC terminal 30. The control circuit board 39 mounts a driving circuit 37, a microcomputer 36, and an insulated power source 38.

The power module unit PMU, a driving circuit unit DCU, and a motor control unit MCU are assembled into the above-described structure and are housed in a metal inverter case capable of electromagnetic shielding. Outside the inverter case, the DC terminal 33 and the AC terminal 30 are exposed. The DC terminal 33 is electrically connected to a power cable that is electrically connected to a high-voltage battery HBA. The AC terminal 30 is electrically connected to a motor cable that is electrically connected to a motor generator M/G.

The assembly of the power module unit PMU, the driving circuit unit DCU, and the motor control unit MCU is housed in the inverter case, as described above. Thus, the inverter INV is completed. The DC terminal 33 exposed to the outside from the inverter case is electrically connected to the power cable that is electrically connected to the high-voltage battery HBA, while the AC terminal 30 exposed to the outside from the inverter case is electrically connected to the motor cable that is electrically connected to the motor generator M/G.

The embodiment described above can improve the heat radiation of the power semiconductor device 3. Thus, the embodiment can achieve the size reduction of the inverter INV by miniaturizing the power module unit PMU by improving the cooling performance of the power module unit PMU.

The embodiment is constructed such that the DC negative-electrode-side wiring member 5 and the DC positive-electrode-side wiring member 6 which pass opposite currents therethrough are placed with the elastic member 8 therebetween to form a pressing jig, and the pressing jig is disposed in the vicinity of the power semiconductor device 3. This structure reduces the stray inductance of the DC negative-electrode-side wiring member 5 and the DC positive-electrode-side wiring member 6. Thus, the serge overvoltage of the DC negative-electrode-side wiring member 5 and the DC positive-electrode-side wiring member 6 can be reduced. Accordingly, the embodiment can reduce the loss generated at the switching of the power semiconductor devices 3, thereby improving the breaking tolerance of the power semiconductor device 3 due to overvoltage.

According to the embodiment, the DC negative-electrode-side wiring member 5 and the DC positive-electrode-side wiring member 6 are disposed in the recess 7 as a pressing jig. This enables the space on the radiator base 2 to be used effectively, allowing the control circuit board 39 that mounts the DC terminal 33, the AC terminal 30, the current sensor 31, the electrolytic capacitor 32, the driving circuit 37, the microcomputer 36, and the insulated power source 38 to be disposed efficiently in the vicinity of the power module unit PMU. Thus, the embodiment can achieve further size reduction of the inverter INV.

The embodiment has the second fixing jig 4 on the top of the radiator base 2 so to close the upper open part of the recess 7, thus preventing the disengagement of the power semiconductor device 3, the first fixing jig 1, and the pressing jig from the recess 7.

The embodiment is constructed such that the leads 11c, 11e, and 11g of the power semiconductor devices 3, the first connecting portion 5a and the second connecting portion 5c of the DC negative-electrode-side wiring member 5, and the first connecting portion 6a and the second connecting portion 6c of the DC positive-electrode-side wiring member 6 pass through the through holes 4b and 4c of the second fixing jig 4, so that they can be fixed with the second fixing jig 4. This arrangement can reduce the stress due to external stress such as vibration on the junction between the collector lead 11c of the power semiconductor device 3 and the first connecting portion 5a of the DC negative-electrode-side wiring member 5, the junction between the emitter lead 11e of the power semiconductor device 3 and the first connecting portion 6a of the DC positive-electrode-side wiring member 6, the junction between the second connecting portion 5c and the third connecting portion 5d of the DC negative-electrode-side wiring member 5, the junction between the second connecting portion 6c and the third connecting portion 6d of the DC positive-electrode-side wiring member 6, and the junction between the leads 11c and 11e of the power semiconductor device 3 and the AC U-phase (V-phase, W-phase) wiring member 29U (29V, 29W). Therefore, the embodiment can improve the life of the electrical connection of the junctions.

The embodiment is constructed such that the DC terminal 33, the AC terminal 30, the current sensor 31, the electrolytic capacitor 32, the third connecting portion 5d of the DC negative-electrode-side wiring member 5, the second connecting portion 6c of the DC positive-electrode-side wiring member 6, and the AC U-phase (V-phase, W-phase) wiring member 29U (29V, 29W) are fixed to the second fixing jig 4 or integrated therewith by integral molding. This saves components for fixing them and their space for installation. Thus, the embodiment can achieve further reduction in size and cost of the inverter INV. Furthermore, the embodiment can prevent the breakage and failure of the components due to vibration.

The embodiment is constructed such that the control circuit board 39 that mounts the driving circuit 37, the microcomputer 36, and the insulated power source 38 is fixed to the supports 4d of the second fixing jig 4. This arrangement reduces components for fixing them and their installation space. Thus, the embodiment can achieve further reduction in size and cost of the inverter INV. Furthermore, the embodiment can prevent the breakage and failure of the components due to vibration.

Figure 12:
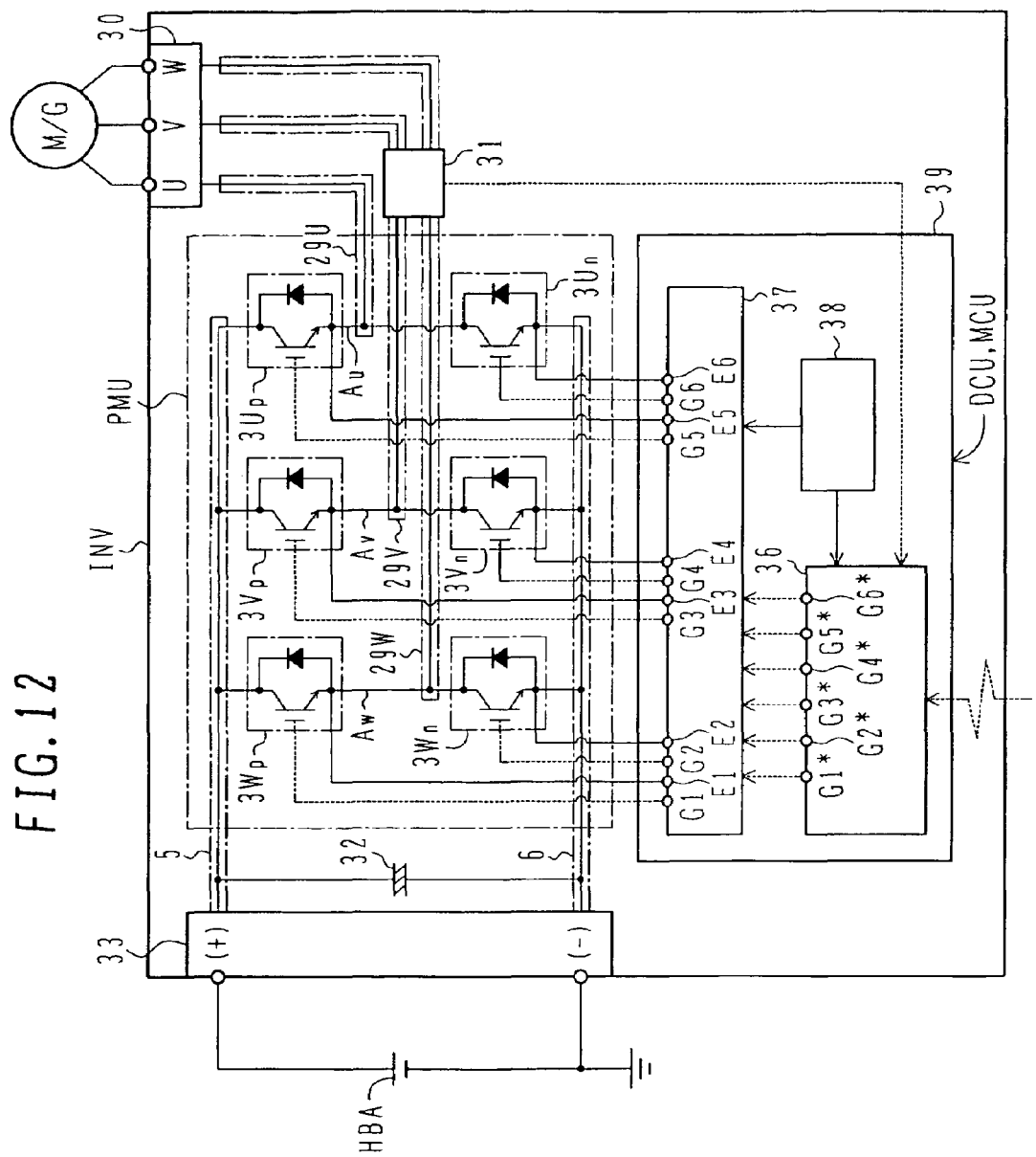
FIG. 12 is a circuit diagram of the on-vehicle inverter using the semiconductor unit according to the first embodiment.

Referring now to FIG. 12, the electrical circuit structure of the inverter INV of the embodiment will be described.

FIG. 12 is a circuit diagram of the on-vehicle inverter INV using the semiconductor unit according to the first embodiment of the invention.

The inverter INV includes the power module unit PMU, the driving circuit unit DCU, and the motor control unit MCU. In this embodiment, the power line is indicated by solid lines and the signal line is indicated by dotted lines for easy discrimination of the power line and the signal line.

The power module unit PMU constitutes the main circuit for power conversion (converter), which operates in response to the driving signal output from the driving circuit unit DCU to convert the DC power supplied from the high-voltage battery HBA to three-phase AC power, and supplies it to the stator winding of the motor generator M/G. The main circuit is a three-phase bridge circuit, in which a three-phase series circuit is electrically connected in parallel between the positive electrode and the negative electrode of the high-voltage battery HBA.

The series circuit is also called an arm, in which the upper-arm power semiconductor devices and the lower-arm power semiconductor devices are electrically connected in series. In this embodiment, an IGBT which is a switching device is used as a power semiconductor device. The IGBT includes a collector electrode, an emitter electrode, a gate electrode, and a sensor electrode. A diode is electrically connected between the collect electrode and the emitter electrode of the IGBT. The diode has two electrodes, a cathode electrode and an anode electrode, in which the cathode electrode is electrically connected to the collector electrode and the anode electrode is electrically connected to the emitter electrode so that the direction from the emitter electrode to the collector electrode is forward.

A U-phase arm Au is configured such that the emitter electrode of a power semiconductor device 3Up and the collector electrode of a power semiconductor device 3Un are electrically connected in series. A V-phase arm Av and a W-phase arm Aw have the same configuration as the U-phase arm Au, in which the emitter electrodes of power semiconductor devices 3Vp and 3Wp and the collector electrodes of power semiconductor devices 3Vn and 3Wn are electrically connected in series, respectively.

The collector electrodes of the power semiconductor devices 3Up, 3Vp, and 3Wp are electrically connected to the higher potential (positive electrode) of the high-voltage battery HBA via the DC (input) negative-electrode-side wiring member 5 and the DC (input) terminal 33. The emitter electrodes of the power semiconductor devices 3Un, 3Vn, and 3Wn are electrically connected to the lower potential (negative electrode) of the high-voltage battery HBA via the DC (input) positive-electrode-side wiring member 6 and the DC (input) terminal 33.

The midpoint of the U-phase arm Au (the connection between the emitter electrode of the upper-arm power semiconductor device 3Up and the collector electrode of the lower-arm power semiconductor device 3Un) is electrically connected to the U-phase stator winding of the motor generator M/G via the AC (output) U-phase wiring member 29U and the AC (output) terminal 30. Like the midpoint of the U-phase arm Au, the midpoints of the V-phase arm Av and the W-phase arm Aw are also electrically connected to the V-phase and W-phase stator windings of the motor generator M/G via the AC (output) V-phase and the AC (output) W-phase wiring members 29V and 29W and the AC (output) terminal 30, respectively.

The power semiconductor device may be a metal oxide semiconductor field-effect transistor (MOSFET). The MOSFET has a drain electrode, a source electrode, a gate electrode, and a sensor electrode. Since the MOSFET has a parasitic diode between the source electrode and the drain electrode, which is biased forward in the direction from the drain electrode to the source electrode, there is no need to have another diode unlike the IGBT.

Between the positive electrode and the negative electrode of the high-voltage battery HBA, the smoothing electrolytic capacitor 32 is electrically connected to prevent variations in DC power, which are caused by the operation of the power semiconductor device.

The driving circuit unit DCU constitutes the driver of the inverter INV. The motor control unit MCU constitutes the controller of the inverter INV. The driving circuit unit DCU and the motor control unit MCU are sometimes collectively called a controller.

The driving circuit unit DCU includes the driving circuit 37 that outputs driving signals for driving the power semiconductor devices 3Up to 3Wn from terminals G1 to G6 to the gate electrodes of the power semiconductor devices 3Up to 3Wn. The driving circuit 37 is constituted of a what-is-called 6-in-1 type integrated circuit (IC) in which a plurality of circuits corresponding to the upper and lower arms of each phase is integrated into one circuit. The driving circuit 37 is mounted on the control circuit board 39. The circuits for the upper and lower arms of each phase include an interface circuit, a gate circuit, and an anomaly detection circuit. The circuits for the upper and lower arms of each phase of the driving circuit 37 are operated by the voltage applied from the insulated power source 38, e.g., a 13-V DC voltage with reference to the potential of the source electrodes of the corresponding power semiconductor devices 3Up to 3Wn. Therefore, ground terminals E1 to E6 of the driving circuit 37 are electrically connected to the source electrodes of the corresponding power semiconductor devices 3Up to 3Wn. For the lower arms, the ground potential is set as the reference.

The motor control unit MCU has the microcomputer 36 that calculates control values for operating the power semiconductor devices of the power module unit PMU from a plurality of input signals, and outputs the calculated control values to the driving circuit unit DCU as control signals. The microcomputer 36 is operated by the voltage applied from the insulated power source 38, e.g., a 5-V DC voltage, and is mounted on the control circuit board 39 together with the driving circuit 37.

To the microcomputer 36, a torque command signal (torque command value) and a detection signal (current value) are input as input signals. The torque command signal is output from a general control unit GCU according to a vehicle driving mode. The detection signal is output from the current sensor 31. The current sensor 31 is constituted of a shunt resistor or a current transformer (CT), for sensing the V-phase and W-phase currents supplied from the power module unit PMU to the stator winding of the motor generator M/G.

The microcomputer 36 calculates the current command values Id* and Iq* of axes d and q from the input signals, from which it calculates voltage control values Vu to Vw, and outputs the calculated voltage control values Vu to Vw from terminals G1* to G6* to the driving circuit 37 as control signals (PWM signal (pulse-width modulation signals)) Vpu* to Vnw* for operating the power semiconductor devices of the power module unit PMU.

The insulated power source 38 is the power source for the driving circuit 37 and the microcomputer 36, which includes a voltage transformer. The primary side (higher-voltage side) of the insulated power source 38 is connected to a low-voltage battery LBA. The secondary side (lower-voltage side) of the insulated power source 38 is constructed to output different voltages, and is electrically connected to the driving circuit 37 and the microcomputer 36. To the power terminal of the driving circuit 37 from the secondary side (lower voltage) of the insulated power source 38, for example, a 13-V DC voltage is applied as operating voltage; to the power terminal of the microcomputer 36 from the secondary side (lower voltage) of the insulated power source 38, for example, a 5-V DC voltage is applied.

Figure 13:
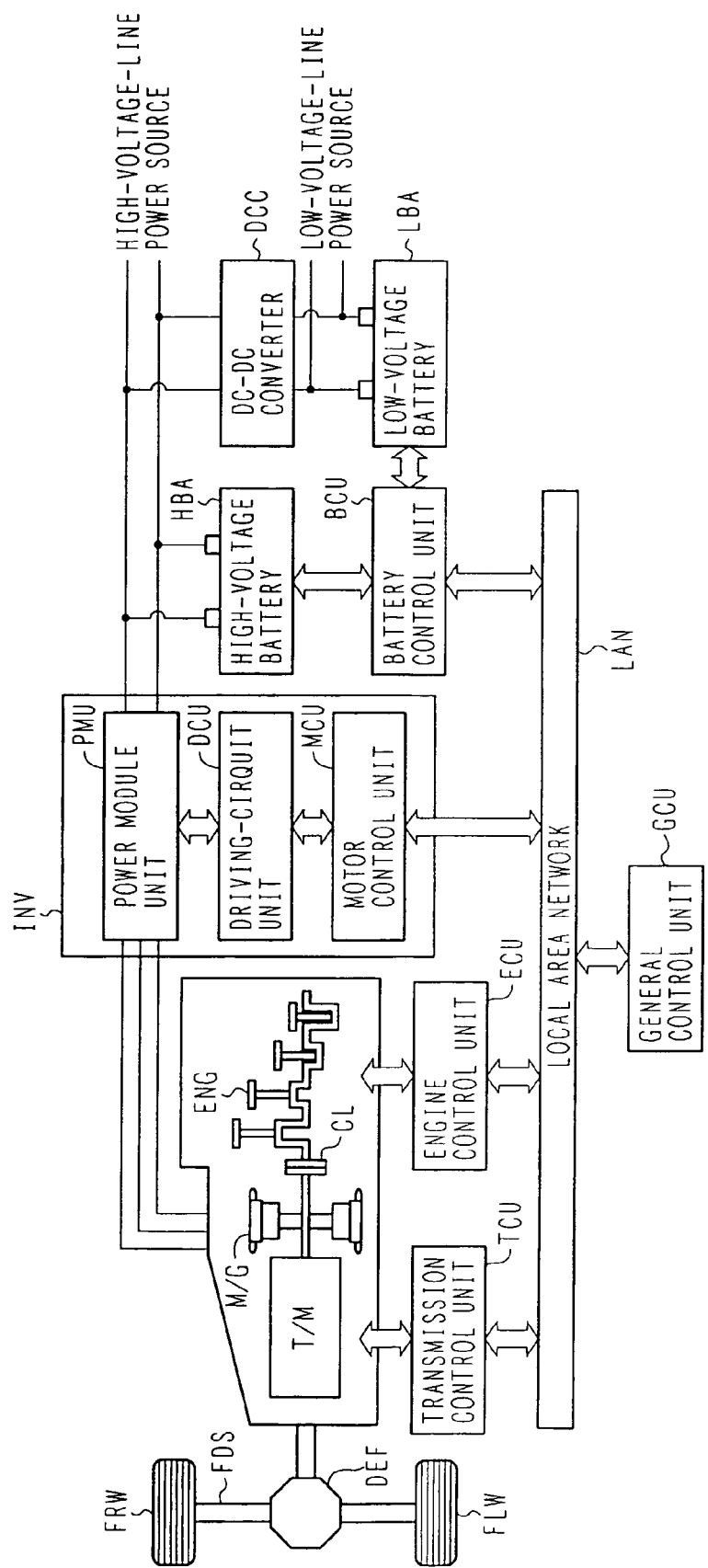
FIG. 13 is a system block diagram of a hybrid car that has the inverter INV according to the first embodiment.

Referring to FIG. 13, the structure of a hybrid car that has the inverter INV of the embodiment will be described.

FIG. 13 is a system block diagram of the hybrid car that has the inverter INV according to the first embodiment of the invention.

The hybrid electric vehicle (hereinafter, referred to as an HEV) of the embodiment is a kind of motor vehicle, which has two power systems, one of which is an engine system that uses an engine ENG which is an internal combustion engine as a power source. The engine system is mainly used as an HEV driving source. The other is an on-vehicle electrical system that uses a motor generator M/G as a power source. The on-vehicle electrical system is mainly used as the driving source and the power generating source of the HEV.

At the front of the vehicle body (not shown), front-wheel drive shafts FDS are rotatably supported. On both ends of the front-wheel drive shafts FDS is provided a pair of front wheels FLW and FRW. Although not shown, at the rear of the vehicle body, a rear wheel shaft having a pair of rear wheels on both ends is rotatably supported.

The HEV of the embodiment employs a front-wheel driving system. Therefore, a differential gear DEF is disposed in the center of the front-wheel drive shaft FDS. The front-wheel drive shaft FDS is mechanically connected to the output of the differential gear DEF. The input of the differential gear DEF is mechanically connected to the output of a transmission T/M. The differential gear DEF is a power distributor, which distributes the torque transmitted from the transmission T/M to the right and left front-wheel drive shafts FDS. The transmission T/M is a power transmission mechanism, which changes the torque transmitted to the transmission T/M and transfers it to the differential gear DEF. The torque to be transmitted to the transmission T/M is transmitted from the engine ENG and the motor generator M/G.

The engine ENG has a plurality of components such as an injector, a throttle valve, an ignitor, and intake and exhaust valves (all are not shown). The injector is a fuel injection valve for controlling the amount of fuel injected into the cylinder of the engine ENG. The throttle valve is for controlling the air to be supplied into the cylinder of the engine ENG. The ignitor is an ignition source for igniting the fuel air mixture in the cylinder of the engine ENG. The intake and exhaust valves are switching valves disposed on the air intake and exhaust ports of the cylinder of the engine ENG, whose open and close timings are controlled according to the operation cycle of the engine ENG.

The components are controlled by an engine control unit ECU. The engine control unit ECU calculates control signals (control values) for operating the components from the command signals (command values) output from upper controllers, signals (various parameters) output from various sensors and other controllers, and data and map stored in storage units. The calculated control signals (control values) are output to the drivers of the components. Thus, the operations of the components are controlled, so that the operation of the engine ENG is controlled.

The transmission T/M has a gear-shift mechanism. The gear-shift mechanism is composed of a plurality of gears, in which the transmission route of the gears that transfer the torque from the input shaft to the output shaft is varied according to the vehicle driving condition, so that a plurality of gear ratios is obtained. The gear-shift mechanism is controlled by a transmission control unit TCU. The transmission control unit TCU calculates a control signal (control value) for operating the gear-shift mechanism from the command signals (command values) output from upper controllers, signals (various parameters) output from various sensors and other controllers, and data and map stored in storage units. The calculated control signals (control values) are output to the driver of the gear-shift mechanism. Thus, the operation of the gear-shift mechanism is controlled, so that the operation of the transmission T/M is controlled.

The motor generator M/G is disposed between the engine ENG and the transmission T/M in an engine room at the front of the vehicle. Therefore, one end of the rotation shaft of the rotor of the motor generator M/G is mechanically connected to the input shaft of the transmission T/M, while the other end is mechanically connected to the crankshaft of the engine ENG via a clutch CL.

When the vehicle is in a powering mode by the motor generator M/G or a regenerative mode by the motor generator M/G, the clutch CL is released to mechanically connect only the motor generator M/G to the transmission T/M. Thus, the torque of the motor generator M/G is transmitted to the transmission T/M. When the vehicle in a powering mode by both of the engine ENG and the motor generator M/G, the clutch CL is brought into engagement mechanically connect both of the engine ENG and the motor generator M/G to the transmission T/M. Thus, the torques of both of the engine ENG and the motor generator M/G are transmitted to the transmission T/M. When the vehicle is in a powering mode by the engine ENG, the clutch CL is brought into engagement to mechanically connect both of the engine ENG and the motor generator M/G to the transmission T/M. Thus the torque of the engine ENG is transmitted to the transmission T/M. At that time, the motor generator M/G rotates therewith.

When the engine ENG is started during the powering mode by the motor generator M/G, the clutch CL is brought into engagement in such a manner as to slide to thereby mechanically connect the engine ENG and the motor generator M/G. Thus, part of the torque of the motor generator M/G is transmitted to the engine ENG via the clutch CL.

As the motor generator M/G, a permanent-magnet AC synchronizer is used. The motor generator M/G includes a stator and a rotor that is rotatably disposed around the inner periphery of the stator with a space therebetween. The stator is constructed such that a three-phase winding of the stator is mounted in a plurality of slots at the stator core by distributed-winding (the way of winding in which two sides of the winding are housed in two slots spaced across some of the slots therebetween) or by concentrated winding (the way of winding in which a coil is wound around the teeth between adjacent slots, and two sides of the winding are housed in the adjacent slots). The rotor is constructed such that a plurality of permanent magnets is embedded in the outer periphery of the rotor core. The motor generator M/G of the embodiment causes torque by the magnetic flux of the permanent magnets and reluctance torque by the magnetic flux passing through the magnetic part (auxiliary magnetic pole) between adjacent different-pole permanent magnets, and outputs the combination of the torques as a rotation driving force to the transmission T/M.

The operation of the motor generator M/G is controlled by the inverter INV. The three-phase stator winding of the stator is supplied with three-phase AC power from the inverter INV. Thus, the stator generates a rotating magnetic field. The three-phase AC power supplied to the stator winding is controlled by the inverter INV so that the synthetic vector of the magnetomotive force of the stator produced by the current supplied to the stator winding is directed to the rotating direction with respect to the magnetic pole center of the auxiliary magnetic pole of the rotor. When the stator generates the rotating magnetic field, the rotor causes torque by the magnetic flux of the permanent magnets and reluctance torque by the magnetic flux passing through the auxiliary magnetic pole. Thus, the rotor generates a rotation driving force according to the three-phase AC power. That is, the motor generator M/G acts as a motor.

The motor generator M/G receives the kinetic energy of the vehicle via the transmission T/M to act as a motor. When the rotor rotates, the magnetic flux of the permanent magnets links with the stator winding to induce electromotive force to the stator winding. Thus, the stator generates three-phase AC power according to the rotation speed of the rotor. That is, the motor generator M/G acts as a generator. The generated three-phase AC power is supplied to the inverter INV. The inverter INV converts the three-phase AC power to DC power. The DC power converted is supplied to the high-voltage battery HBA and charged therein.

The inverter INV is a power converter that converts the DC power supplied from the high-voltage battery HBA to three-phase AC power, and includes the power module unit PMU, the driving circuit unit DCU, and the motor control unit MCU.

The power module unit PMU configures a converting main circuit of the inverter INV, which includes a plurality of power semiconductor devices. The motor control unit MCU configures the controller of the inverter INV, and calculates control signals (control values) for switching (on and off) the power semiconductor devices on the basis of the command signals (command values) output from upper controllers, signals (various parameters) output from various sensors and other controllers, and data and map stored in storage units. The calculated control signals (control values) are output to the driving circuit unit DCU. The driving circuit unit DCU constitutes the driver for the inverter INV, which generates driving signals for switching the power semiconductor devices in response to the control signals (control values) output from the motor control unit MCU. The generated driving signals are output to the power module unit PMU.

The power system of the HEV includes two lines of a high-voltage power and a low-voltage power. The high-voltage power is used as the power source of the motor generator M/G, and has a high-voltage battery HBA having a nominal output voltage of 200 to 350 V. The low-voltage power is used as the power source of auxiliary equipment such as a starter for starting the engine ENG, a radio, and lights, and control units such as the engine control unit ECU, the transmission control unit TCU, the motor control unit MCU, the battery control unit BCU, and the general control unit GCU, and has a low-voltage battery BA2 whose nominal output voltage is 12 V.

The high-voltage battery HBA (high-voltage power) is connected to the input (DC) of the inverter INV. Thus, the high-voltage battery HBA and the inverter INV can mutually apply and receive DC power. When the motor generator M/G is operated as a motor, DC power stored in the high-voltage battery HBA is supplied to the inverter INV, where it is converted to three-phase AC power. When the motor generator M/G is operated as a generator, DC power output from the inverter INV is supplied to a high-voltage electric load, where it is consumed as driving power, and is supplied to the high-voltage battery HBA to charge it.

The low-voltage battery LBA (low-voltage power) is connected to the high-voltage battery HBA via a bidirectional DC-DC converter DCC. Thus, the low-voltage battery LBA and the high-voltage battery HBA can mutually apply and receive DC power at different voltage levels. When low DC voltage is applied to a low-voltage electric load and when the low-voltage battery LBA is charged, the DC power supplied from the high-voltage battery HBA is lowered by the DC-DC converter DCC and is supplied to the low-voltage battery LBA. When the high-voltage battery HBA needs backup, the DC power supplied from the low-voltage battery LBA is boosted by the DC-DC converter DCC and is supplied to the high-voltage battery HBA.

The charge and discharge and the life of the high-voltage battery HBA and the low-voltage battery LBA are controlled by the battery control unit BCU. To the battery control unit BCU, the voltage values and current values of the high-voltage battery HBA and the low-voltage battery LBA are input to control the charge and discharge and the life of the batteries.

The DC-DC converter DCC has a semiconductor module, a reactor, and a driving circuit (all are not shown). The semiconductor module constitutes the switch of a step-up/down circuit for the DC power of the DC-DC converter DCC, and has a plurality of switching semiconductor devices. The reactor is a magnetic device constituting the electromagnetic-energy storing section of the step-up/down circuit, in which two windings are wound around a ring-shaped magnetic core. The driving circuit constitutes the driver of the DC-DC converter DCC, and generates driving signals for switching (on and off) the switching semiconductor devices. The driving signals are output to the power semiconductor devices of the module. The controller that outputs the control signals to the driving circuit is combined in the DC-DC converter DCC or the battery control unit BCU.

The engine control unit ECU, the transmission control unit TCU, the motor control unit MCU, and the battery control unit BCU are electrically connected to one another using a local area network LAN. The local area network LAN is electrically connected to the general control unit GCU. This enables bidirectional signal transmission among the controllers, thus allowing mutual transmission of information and sharing of detected values.

The general control unit GCU outputs command signals to the controllers according to the driving condition of the vehicle. For example, the general control unit GCU calculates torque necessary for the vehicle in accordance with the degree of depression of the accelerator by the driver, and distributes the necessary torque into torque to be output by the engine ENG and torque to be output by the motor generator M/G so as to improve the driving efficiency of the engine ENG. The distributed output torque of the engine ENG is output to the engine control unit ECU as an engine-torque command signal. The distributed output torque of the motor generator M/G is output to the motor control unit MCU as a motor-torque command signal.

The HEV of the embodiment has a plurality of driving modes. The operation of the two power systems is controlled in accordance with the driving mode.

At the start and at low-speed traveling of the hybrid electric vehicle (at which the driving efficiency of the engine ENG is low), or at low-load traveling (low-speed traveling or middle-speed traveling), the vehicle goes into a powering mode in which the motor generator M/G is used as a driving source. In this case, the DC voltage supplied from the high-voltage battery HBA is converted to specified three-phase AC power by the inverter INV, and it is supplied to the motor generator M/G. Thus, the motor generator M/G acts as a motor, and delivers rotation driving force according to the torque required by the vehicle. At that time, the engine ENG is separated from the driving system by the clutch CL.

At the middle-speed traveling of the vehicle (at which the driving efficiency of the engine ENG is high), or at high-speed traveling (at which the air-fuel ratio of the engine ENG is at stoichiometry), the vehicle goes into a powering mode in which the engine ENG is used as a driving source. In this case, the operations of the components of the engine ENG are controlled by the engine control unit ECU, and the engine ENG outputs rotation driving force according to the torque required by the vehicle. The driving force is transmitted to the transmission T/M via the motor generator M/G. At that time, the motor generator M/G is rotated along with the engine ENG. Thus, the motor generator M/G can be either used as a generator or not. Alternatively, another generator may be used to generate power.

At high-load traveling such as acceleration, the vehicle comes into a powering mode in which the engine ENG and the motor generator M/G are used as driving source. In this case, their two powering modes are combined, in which rotation driving force according to the torque required by the vehicle is output from the engine ENG and the motor generator M/G so as to improve the driving efficiency of the engine ENG.

At the deceleration or braking of the vehicle, the vehicle comes into a regeneration mode in which the motor generator M/G is operated as a generator. In this case, the three-phase AC power generated by the motor generator M/G is converted to specified three-phase AC power by the inverter INV, and it is supplied to the high-voltage battery HBA. Thus, the DC power supplied from the inverter INV is charged into the high-voltage battery HBA. The operation is the same as that for the generation in the powering mode by the engine ENG.

Figure 14:
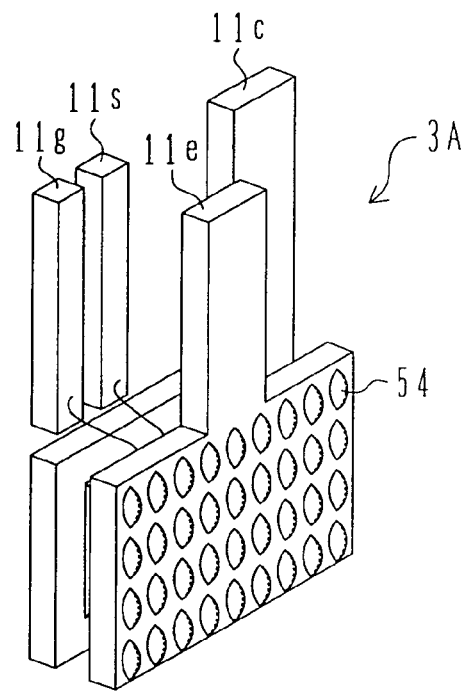
FIG. 14 is a perspective view of a semiconductor unit according to a second embodiment of the invention.
Figure 15:
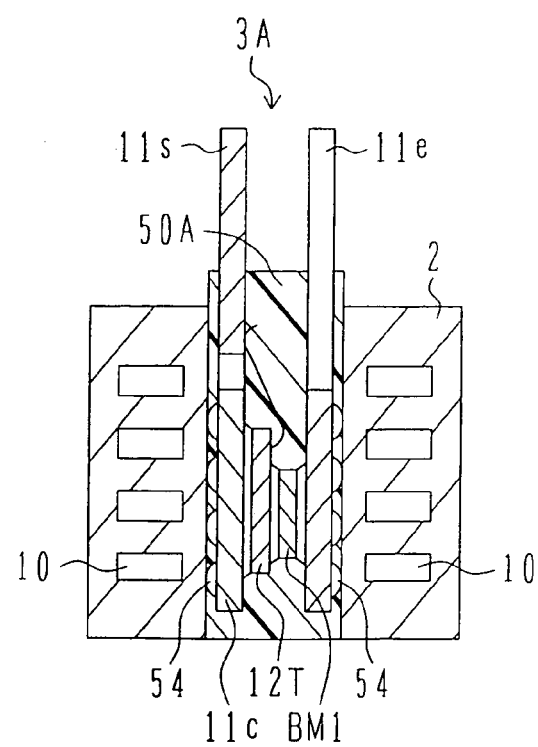
FIG. 15 is a sectional view of the semiconductor unit of the second embodiment.

Referring to FIGS. 14 and 15, the structure of a semiconductor unit according to a second embodiment of the invention will be described.

FIG. 14 is a perspective view of the semiconductor unit according to the second embodiment of the invention; and FIG. 15 is a sectional view of the semiconductor unit of the second embodiment. The same numerals as in FIGS. 1 to 5 indicate the same components.

In this embodiment, as shown in FIG. 14, a power semiconductor device 3A has a plurality of insulative high-thermal-conductivity projections 54 on the surface of the emitter lead 11e (on the surface facing the inside of the radiator base 2). Likewise, the insulative high-thermal-conductivity projections 54 (not shown in FIG. 14) are provided also on the surface of the collector lead 11c (on the surface facing the inside of the radiator base 2).

The insulative high-thermal-conductivity projections 54 are made of a material of electrical insulation and high thermal conductivity. One example is a mixture of epoxy resin and silica. For example, a mixture of 20 w % epoxy resin and 80 w % silica powder provides an electrical insulation property and high thermal conductivity. In place of silica, alumina, aluminum nitride, or boron nitride can be mixed in resin such as epoxy resin to improve thermal conductivity. The high-thermal-conductivity projections 54 are formed in a height of, e.g., 0.2 mm by screen printing etc.

The power semiconductor device 3A with the structure shown in FIG. 14 is placed in the hollow radiator base 2, as shown in FIG. 3, and is positioned using a jig. Then, it is molded with a high-thermal-conductivity resin 50A, as shown in FIG. 15.

As shown in FIG. 15, with the power semiconductor device 3A insert-molded in the hollow radiator base 2 with the high-thermal-conductivity resin 50A, the high-thermal-conductivity projections 54 are present between the collector lead 11c and the sensor lead 11s and the hollow radiator base 2, and between the emitter lead 11e and the radiator base 2. The insulative high-thermal-conductivity projections 54 have an electrical insulating property and a specified height (e.g., 0.2 mm), as described above. Accordingly, a specified clearance is formed between the radiator base 2 and the collector lead 11c, the sensor lead 11s, and the emitter lead 11e, in which the high-thermal-conductivity projections 54 and the high-thermal-conductivity resin 50A are present, thus ensuring electrical insulation.

The high-thermal-conductivity resin 50A may be made of the same material as the high-thermal-conductivity projections 54. For example, epoxy resin that contains less silica powder than the high-thermal-conductivity projections 54 may be used. The epoxy resin that contains silica powder increases in price as the silica powder increases. Accordingly, the use of an epoxy resin containing a little silica powder reduces the cost of the semiconductor unit.

The high-thermal-conductivity projections 54 may not be limited to be semicircular projections shown in FIG. 14, but may be rectangles or frames screen-printed on the surface of the collector lead 11c or the emitter lead 11e.

As has been described, the semiconductor unit of the embodiment is constructed such that the power semiconductor device 3A is inserted into the hollow radiator base 2, is positioned, and is then molded with the high-thermal-conductivity resin 50A. Therefore, even if the parallelism between the collector lead 11c and the emitter lead 11e is decreased, the heat generated from the power semiconductor device 3A can be transferred to the radiator base 2 via the high-thermal-conductivity resin 50A, because it is insert-molded in the radiator base 2 with the high-thermal-conductivity resin 50A, thus improving the cooling performance. The electrical insulation can be provided by using the high-thermal-conductivity projections 54.

Figure 16:
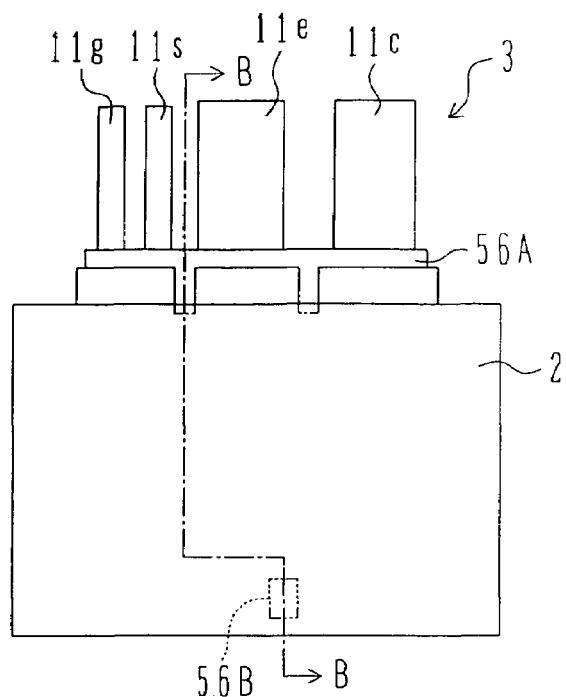
FIG. 16 is a front view of a semiconductor unit according to a third embodiment of the invention.
Figure 17:
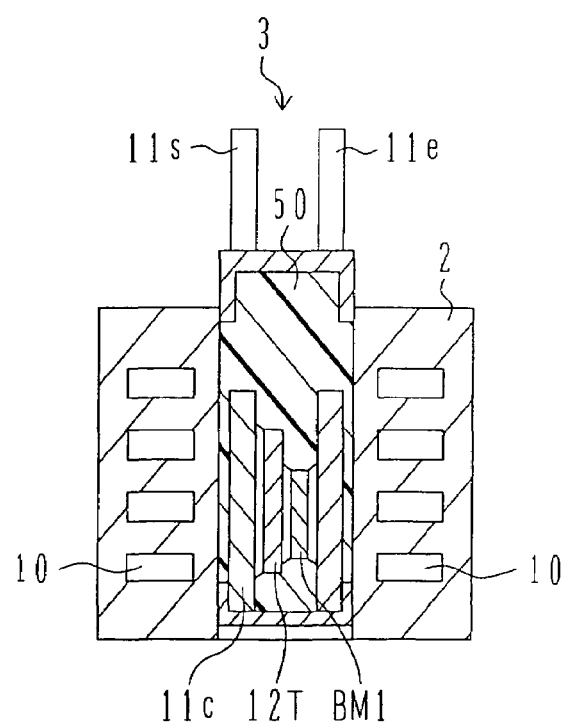
FIG. 17 is a sectional view of the semiconductor unit of the third embodiment.

Referring next to FIGS. 16 and 17, a semiconductor unit according to a third embodiment of the invention will be described.

FIG. 16 is a front view of the semiconductor unit according to the third embodiment of the invention; and FIG. 17 is a sectional view of the semiconductor unit of the third embodiment taken along line B-B of FIG. 16. The same numerals as in FIGS. 1 to 5 indicate the same components.

The embodiment has electrically insulative support jigs 56A and 56B in the radiator base 2 as shown in FIGS. 16 and 17, with which the power semiconductor device 3 is retained, and molded with the high-thermal-conductivity resin 50. The structure of the power semiconductor device 3 is the same as that shown in FIG. 2.

As shown in FIG. 17, in the state in which the power semiconductor device 3 is insert-molded in the hollow radiator base 2 with the high-thermal-conductivity resin 50, the high-thermal-conductivity resin 50 is present between the collector lead 11c and the sensor lead 11s and the radiator base 2 and between the emitter lead 11e and the radiator base 2.

The disposition of the support jigs 56A and 56B between the power semiconductor device 3 and the radiator base 2 makes it possible to keep the distance between the power semiconductor device 3 and the radiator base 2 constant. The disposition of the high-thermal-conductivity resin 50 in the clearance provides electrical insulation.

As has been described, the semiconductor unit of the embodiment is constructed such that the power semiconductor device 3 is inserted into the hollow radiator base 2, where it is positioned, and is then molded with the high-thermal-conductivity resin 50. Therefore, even if the parallelism between the collector lead 11c and the emitter lead 11e is decreased, the heat generated from the power semiconductor device 3 can be transferred to the radiator base 2 via the high-thermal-conductivity resin 50, because it is insert-molded in the radiator base 2 with the high-thermal-conductivity resin 50, thus improving the cooling performance. The use of the support jigs 56A and 56B makes it possible to keep the distance between the power semiconductor device 3 and the radiator base 2 constant, thus keeping the thickness of the high-thermal-conductivity resin 50 constant to ensure electrical insulation.

Figure 18:
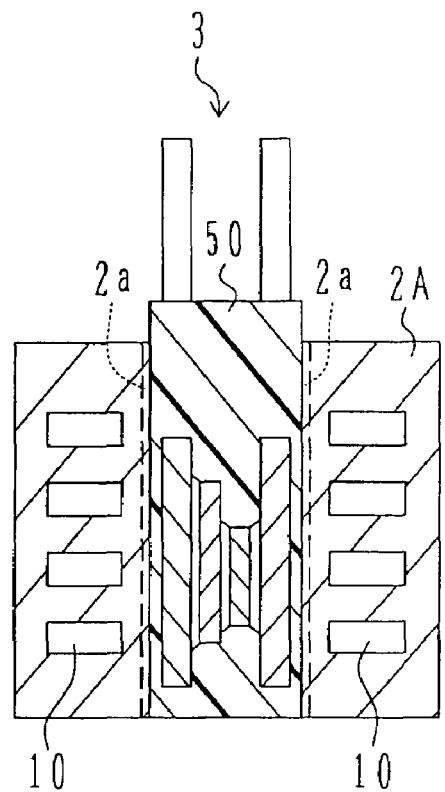
FIG. 18 is a sectional view of a semiconductor unit according to a fourth embodiment of the invention.
Figure 19:
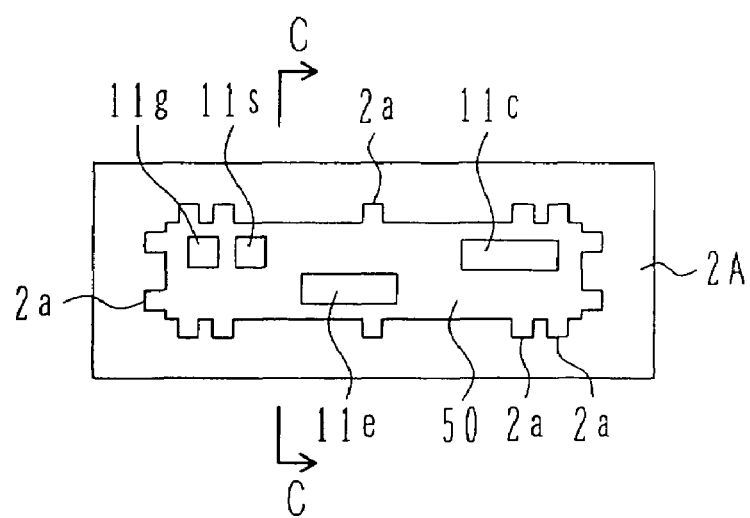
FIG. 19 is a plan view of the semiconductor unit of the fourth embodiment.

Referring next to FIGS. 18 and 19, a semiconductor unit according to a fourth embodiment of the invention will be described.

FIG. 18 is a sectional view of the semiconductor unit according to the fourth embodiment of the invention, taken along line C-C of FIG. 19; and FIG. 19 is a plan view of the semiconductor unit of the fourth embodiment. The same numerals as in FIGS. 1 to 5 indicate the same components.

As shown in FIGS. 18 and 19, the embodiment has a plurality of recesses 2a inside the radiator base 2. The power semiconductor device 3 with the structure shown in FIG. 2 is inserted into the hollow radiator base 2, as shown in FIG. 3, and is positioned using a jig. Then, it is molded with the high-thermal-conductivity resin 50, as shown in FIG. 18. At that time, the high-thermal-conductivity resin 50 is charged also into the recesses 2a inside the radiator base 2.

If the radiator base 2 is made of aluminum and the high-thermal-conductivity resin 50 is made of epoxy resin, separation may occur between the high-thermal-conductivity resin 50 and the radiator base 2 when thermal stress is applied to the semiconductor unit shown in FIG. 18. At that time, the high-thermal-conductivity resin 50 is caught by the recesses 2a of the radiator base 2, thus preventing the separation.

As has been described, the semiconductor unit of the embodiment is constructed such that the power semiconductor device 3 is inserted into the hollow radiator base 2, where it is positioned, and is then molded with the high-thermal-conductivity resin 50. Therefore, even if the parallelism between the collector lead 11c and the emitter lead 11e is decreased, the heat generated from the power semiconductor device 3 can be transferred to the radiator base 2 via the high-thermal-conductivity resin 50, because it is insert-molded in the radiator base 2 with the high-thermal-conductivity resin 50, thus improving the cooling performance. Even if thermal stress is applied to the semiconductor unit of the embodiment, the separation between the high-thermal-conductivity resin 50 and the radiator base 2 can be prevented.

Figure 20:
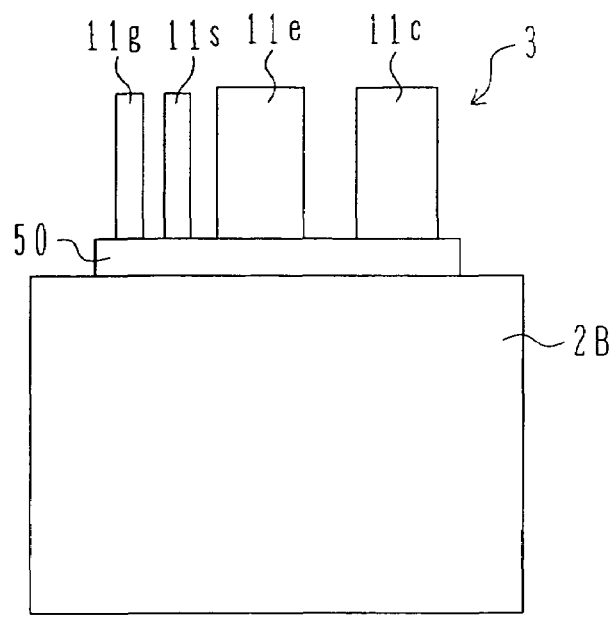
FIG. 20 is a front view of a semiconductor unit according to a fifth embodiment of the invention.
Figure 21:
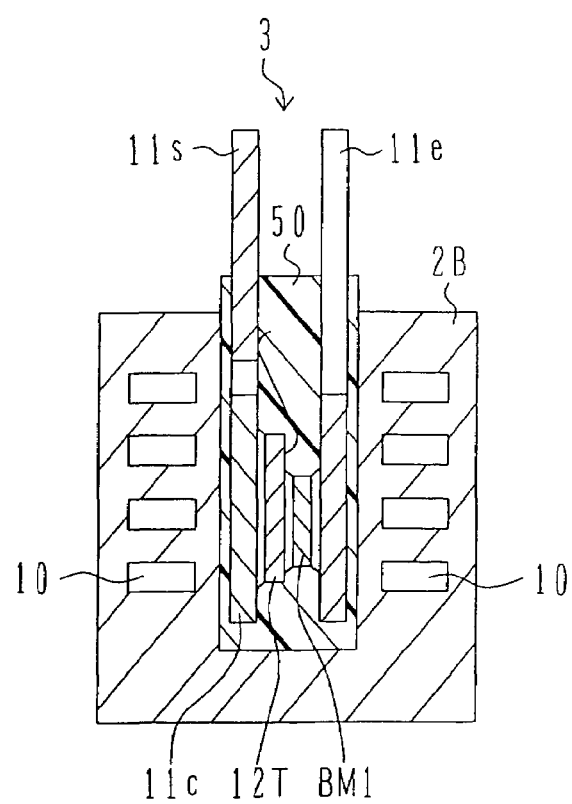
FIG. 21 is a sectional view of the semiconductor unit according to the fifth embodiment.

Referring next to FIGS. 20 and 21, a semiconductor unit according to a fifth embodiment of the invention will be described.

FIG. 20 is a front view of the semiconductor unit according to the fifth embodiment of the invention; and FIG. 21 is a sectional view of the semiconductor unit according to the fifth embodiment. The same numerals as in FIGS. 1 to 5 indicate the same components.

The embodiment uses a bottomed hollow radiator base 2B.

The semiconductor unit of the embodiment is constructed such that the power semiconductor device 3 is inserted into the hollow radiator base 2B, where it is positioned, and is then molded with the high-thermal-conductivity resin 50. Therefore, even if the parallelism between the collector lead 11c and the emitter lead 11e is decreased, the heat generated from the power semiconductor device 3 can be transferred to the radiator base 2B via the high-thermal-conductivity resin 50, because it is insert-molded in the radiator base 2B with the high-thermal-conductivity resin 50, thus improving the cooling performance.

Figure 22:
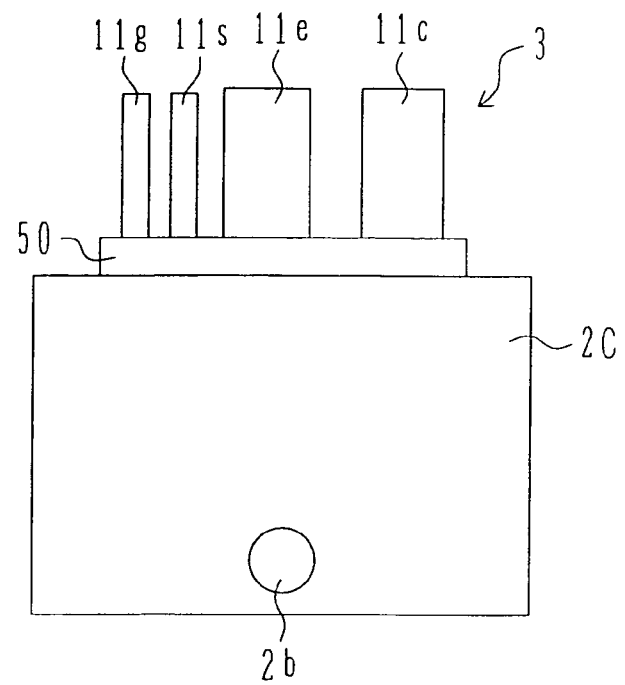
FIG. 22 is a front view of a semiconductor unit according to a sixth embodiment of the invention.
Figure 23:
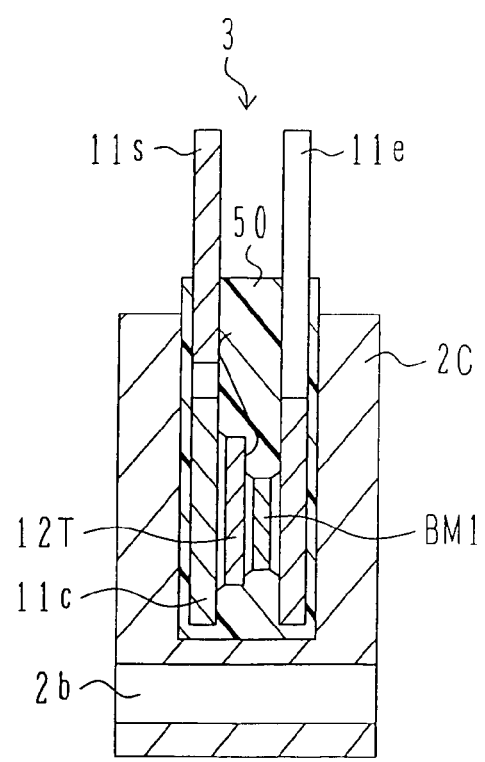
FIG. 23 is a sectional view of the semiconductor unit according to the sixth embodiment.

Referring next to FIGS. 22 and 23, a semiconductor unit according to a sixth embodiment of the invention will be described.

FIG. 22 is a front view of the semiconductor unit according to the sixth embodiment of the invention; and FIG. 23 is a sectional view of the semiconductor unit according to the sixth embodiment. The same numerals as in FIGS. 1 to 5 indicate the same components.

The embodiment uses a bottomed hollow radiator base 2C. The radiator base 2C is different from that shown in FIG. 4, which has no cooling-medium channel for cooling medium to circulate through. The radiator base 2C of the embodiment is mounted to radiating fins or the like with a through hole 2b of the radiator base 2C.

The semiconductor unit of the embodiment is constructed such that the power semiconductor device 3 is inserted into the hollow radiator base 2C, where it is positioned, and is then molded with the high-thermal-conductivity resin 50. Therefore, even if the parallelism between the collector lead 11c and the emitter lead 11e is decreased, the heat generated from the power semiconductor device 3 can be transferred to the radiator base 2C via the high-thermal-conductivity resin 50, because it is insert-molded in the radiator base 2C with the high-thermal-conductivity resin 50, thus improving the cooling performance.

Figure 24:
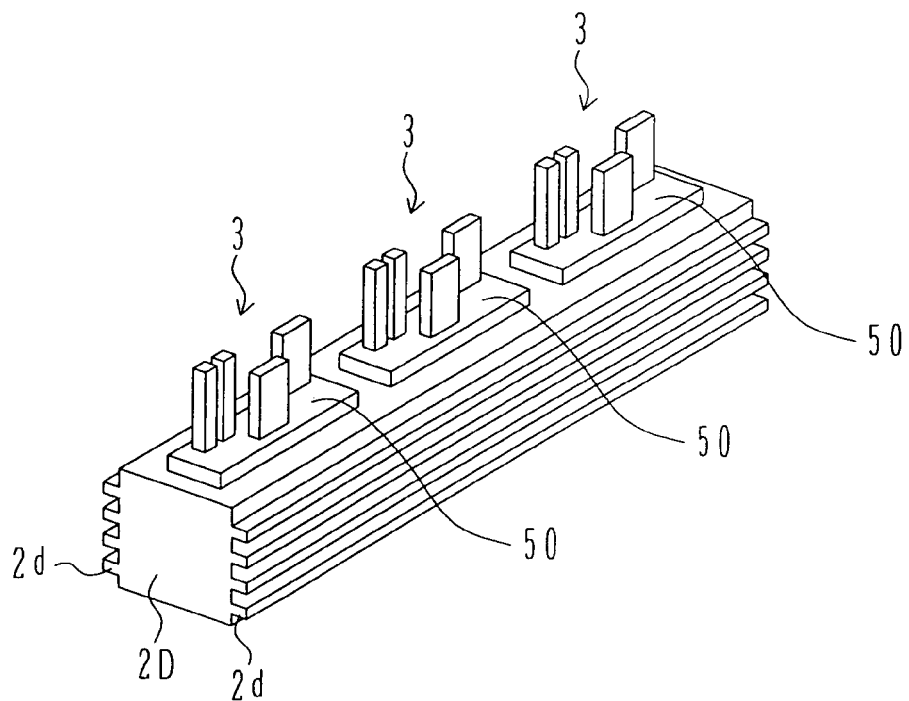
FIG. 24 is a perspective view of a semiconductor unit according to a seventh embodiment of the invention.
Figure 25:
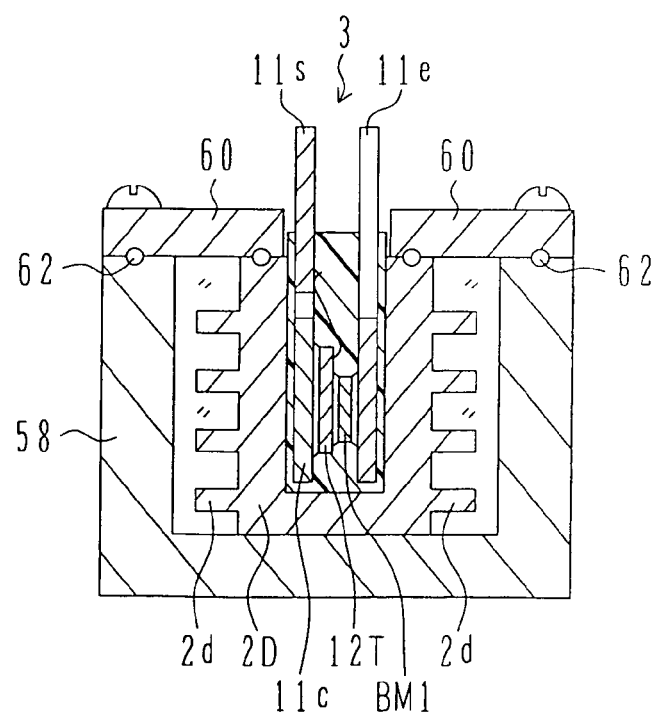
FIG. 25 is a sectional view of the semiconductor unit according to the seventh embodiment.

Referring next to FIGS. 24 and 25, a semiconductor unit according to a seventh embodiment of the invention will be described.

FIG. 24 is a perspective view of the semiconductor unit according to the seventh embodiment of the invention; and FIG. 25 is a sectional view of the semiconductor unit according to the seventh embodiment. The same numerals as in FIGS. 1 to 5 indicate the same components.

The embodiment has a different structure as that shown in FIG. 6, in which a hollow radiator base 2D has radiating fins 2d on its sides, which extend along the length and integrated with the sides by extrusion. The radiator base 2D has not the cooling-medium channel shown in FIG. 6. In the radiator base 2D, the power semiconductor devices 3 are insert-molded with the high-thermal-conductivity resin 50.

As shown in FIG. 25, the radiator base 2D shown in FIG. 24 has a bottomed hollow and is housed in a frame 58. A lid 60 is fixed on the top of the frame 58 with screws. Between the frame 58 and the lid 60, a water-leak shield 62 is provided. A cooling medium such as cooling water circulates between the outer periphery of the bottomed hollow radiator base 2D and the inner periphery of the frame 58. The heat generated from the power element (semiconductor chip) 12T is radiated to the cooling medium through the radiator base 2D and the radiating fins 2d.

As has been described, the semiconductor unit of the embodiment is constructed such that the power semiconductor device 3 is inserted into the hollow radiator base 2D, where it is positioned, and is then molded with the high-thermal-conductivity resin 50. Therefore, even if the parallelism between the collector lead 11c and the emitter lead 11e is decreased, the heat generated from the power semiconductor device 3 can be transferred to the radiator base 2D via the high-thermal-conductivity resin 50 and radiated through the radiating fins 2d, because it is insert-molded in the radiator base 2D with the high-thermal-conductivity resin 50, thus improving the cooling performance.

Referring next to FIGS. 26 to 29, semiconductor units according to eighth to eleventh embodiments of the invention will be described.

Figure 26:
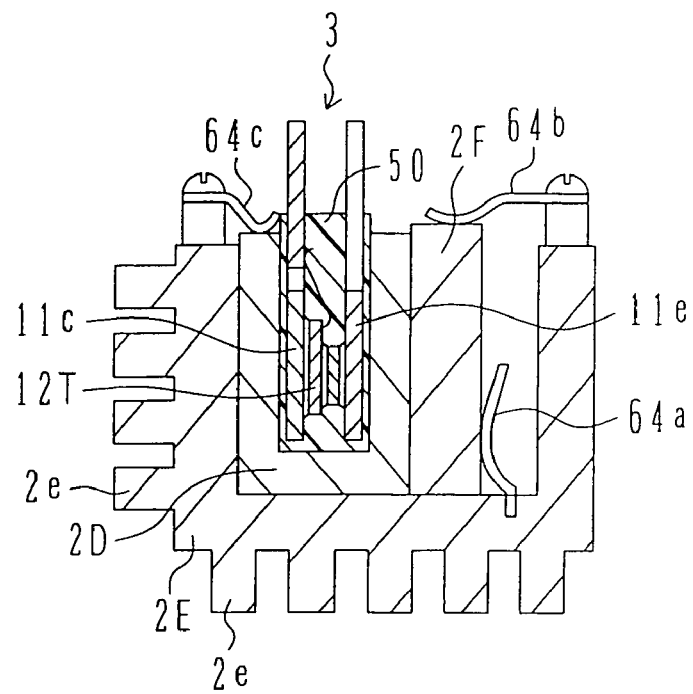
FIG. 26 is a sectional view of a semiconductor unit according to an eighth embodiment of the invention.
Figure 27:
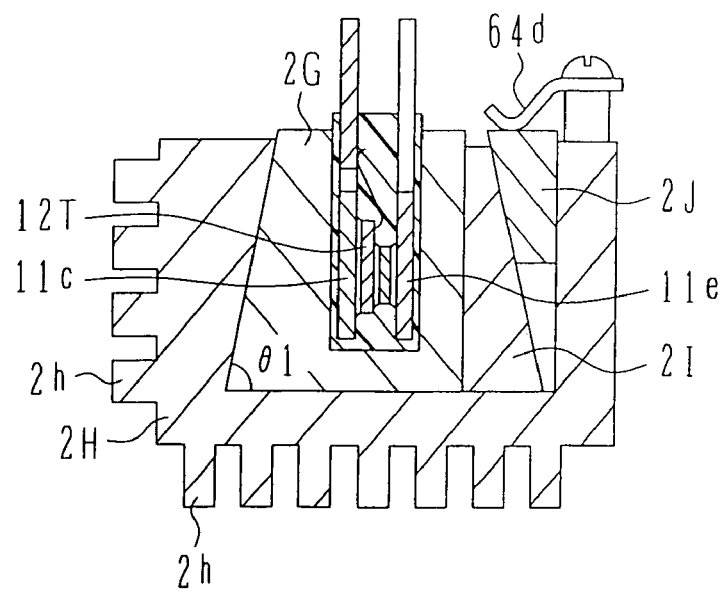
FIG. 27 is a sectional view of a semiconductor unit according to a ninth embodiment of the invention.
Figure 28:
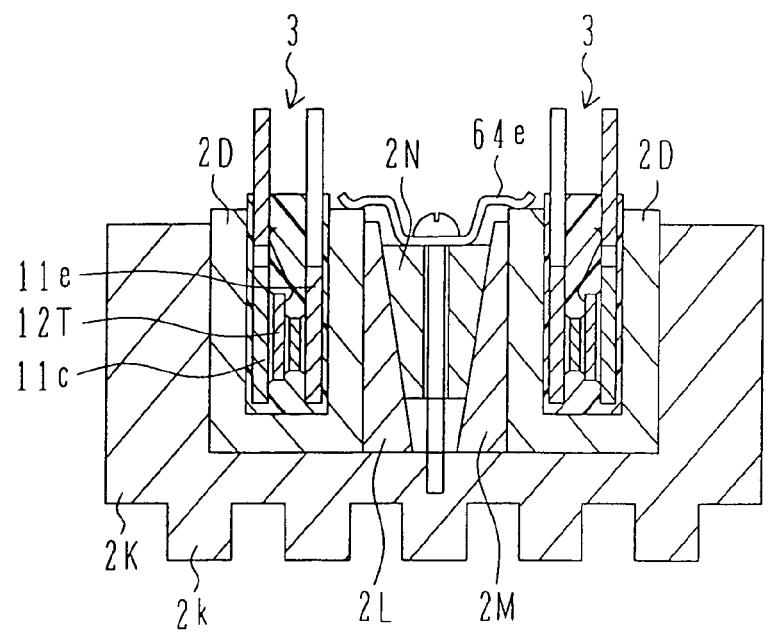
FIG. 28 is a sectional view of a semiconductor unit according to a tenth embodiment of the invention.
Figure 29:
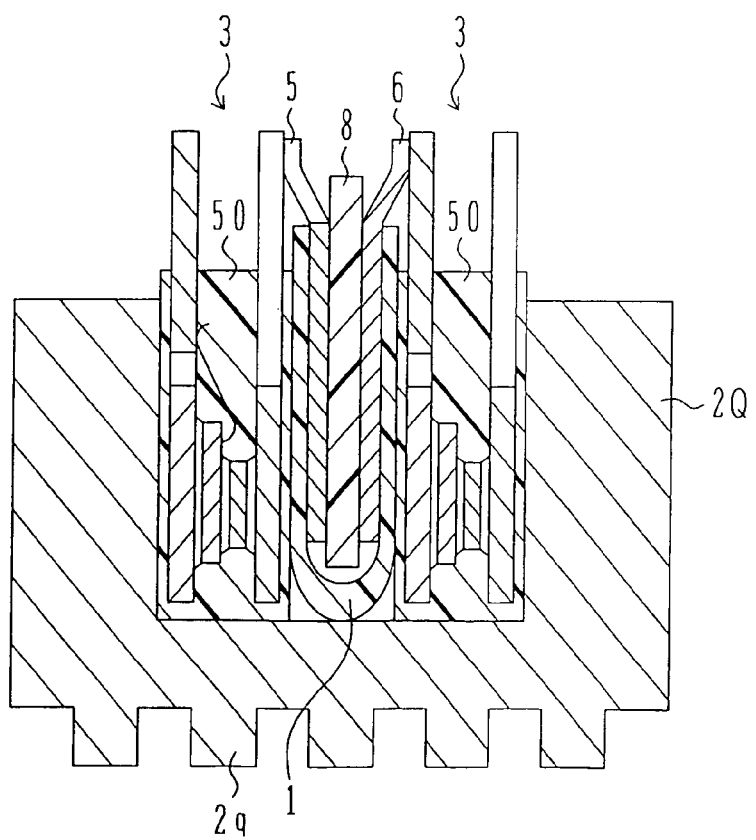
FIG. 29 is a sectional view of a semiconductor unit according to an eleventh embodiment of the invention.

FIG. 26 is a sectional view of the semiconductor unit according to the eighth embodiment of the invention; FIG. 27 is a sectional view of the semiconductor unit according to the ninth embodiment of the invention; FIG. 28 is a sectional view of the semiconductor unit according to the tenth embodiment of the invention; and FIG. 29 is a sectional view of the semiconductor unit according to the eleventh embodiment of the invention. The same numerals as in FIGS. 1 to 5 indicate the same components.

In the embodiments shown in FIGS. 26 to 29, the radiator bases have no cooling-medium channel and no radiating fins, and are closely mounted to a second radiator base having radiating fins.

Referring first to FIG. 26, the eighth embodiment will be described. As shown in FIG. 26, a first radiator base 2D has no cooling-medium channel and no radiating fins. The radiator base 2D accommodates the power semiconductor devices 3, which are insert-molded with the high-thermal-conductivity resin 50.

The radiator base 2D is disposed in contact with the bottom of a second radiator base 2E and one side thereof. Radiating fins 2e are integrated with an outer sidewall and the lower surface of the second radiator base 2E. The other side of the radiator base 2D is in contact with a high-thermal-conductivity pressing member 2F made of aluminum or the like, as is the second radiator base 2E, by a spring 64a. The pressing member 2F is pushed downward by a spring 64b. The radiator base 2D is pushed downward by a spring 64c. Thus, the sides of the radiator base 2D are in contact with the radiator base 2E and the pressing member 2F, and the bottom is in contact with the radiator base 2E.

The angles formed by the right and left sides of the radiator base 2D and the bottom can be accurately set at, e.g., 90°. The angle of the sides of the second radiator base 2E with respect to the inner bottom can also be set at, e.g., 90°. Accordingly, the radiator base 2D can be brought into intimate contact with the second radiator base 2E. Therefore, even if the parallelism between the collector lead 11c and the emitter lead 11e of the power semiconductor 3 is low, the heat generated from the semiconductor chip 12T can be transferred from the radiator base 2D to the radiator base 2E via the high-thermal-conductivity resin 50, and then radiated from the radiating fins 2e to a cooling medium fed around the radiating fins 2e. The radiator base 2E is housed in the frame 58, as shown in FIG. 25, and a cooling medium is fed around the radiating fins 2e.

As has been described, the semiconductor unit of the embodiment is constructed such that the power semiconductor device 3 is inserted into the hollow radiator base 2D, where it is positioned, and is then molded with the high-thermal-conductivity resin 50. The radiator base 2D is retained in close contact with the second radiator base 2E. Therefore, even if the parallelism between the collector lead 11c and the emitter lead 11e is decreased, the heat generated from the power semiconductor device 3 can be transferred to the radiator bases 2D and 2E via the high-thermal-conductivity resin 50 because the power semiconductor device 3 is insert-molded in the hollow radiator base 2D with the high-thermal-conductivity resin 50, and then can be radiated from the radiating fins 2e, thus improving the cooling performance.

Referring then to FIG. 27, the ninth embodiment will be described. As shown in FIG. 27, a first radiator base 2G has no cooling-medium channel and no radiating fins. The radiator base 2G accommodates the power semiconductor device 3, which is insert-molded with the high-thermal-conductivity resin 50. The angle θ1 of one side with respect to the bottom of the radiator base 2G is smaller than 90°, e.g., 85°.

By setting the angle that the side of a second radiator base 2H makes with the inner bottom equal to angle θ1, the radiator base 2G can be disposed in contact with the bottom and one side of the second radiator base 2H. Radiating fins 2h are integrated with an outer sidewall and the lower surface of the second radiator base 2H. On the other side of the radiator base 2G, a high-thermal-conductivity pressing member 2I made of aluminum or the like is disposed similarly to the second radiator base 2H. The right side of the pressing member 2I in the drawing is tapered. A wedge-shaped member 2J is pushed downward by a spring 64d into contact with the tapered surface of the pressing member 2I, so that the pressing member 2I is brought into contact with the radiator base 2G, and the radiator base 2G is brought into contact with the second radiator base 2H. Here, when the angle θ1 is set smaller than 90°, the radiator base 2G can easily be retained in contact with the second radiator base 2H only with one spring 64*d*.

Therefore, even if the parallelism between the collector lead 11*c* and the emitter lead 11*e* of the power semiconductor device 3 is low, the heat generated from the semiconductor chip 12T can be transferred from the radiator base 2G to the radiator base 2H via the high-thermal-conductivity resin 50 and radiated from the radiating fins 2*h* to a cooling medium fed around the cooling fins 2*h*. The radiator base 2H is housed in the frame 58, as shown in FIG. 25, and a cooling medium is fed around the radiating fins 2*h*.

As has been described, the semiconductor unit of the embodiment is constructed such that the power semiconductor device 3 is inserted into the hollow radiator base 2G, where it is positioned, and is then molded with the high-thermal-conductivity resin 50. The radiator base 2G is retained in close contact with the second radiator base 2H. Therefore, even if the parallelism between the collector lead 11*c* and the emitter lead 11*e* is decreased, the heat generated from the power semiconductor device 3 can be transferred to the radiator bases 2G and 2H via the high-thermal-conductivity resin 50, because the power semiconductor device 3 is insert-molded in the hollow radiator base 2G with the high-thermal-conductivity resin 50, and the heat can be radiated from the radiating fins 2*h*, thus improving the cooling performance. The radiator base 2G can easily be retained in close contact with the second radiator base 2H.

Referring then to FIG. 28, the tenth embodiment will be described. This embodiment has two power semiconductor devices 3 in the radiator base. As shown in FIG. 28, the first radiator bases 2D have no cooling-medium channel and no radiating fins. The radiator bases 2D accommodate the power semiconductor devices 3, which are insert-molded with the high-thermal-conductivity resin 50.

The two radiator bases 2D are each disposed in contact with the bottom and one side of a second radiator base 2K. Radiating fins 2*k* are integrated with the outer lower surface of the second radiator base 2K. On the other sides of the two radiator bases 2D, high-thermal-conductivity pressing members 2L and 2M made of aluminum or the like are disposed similarly to the second radiator base 2K. The right side of the pressing member 2L and the left side of the pressing member 2M in the drawing are tapered. A wedge-shaped member 2N is pushed downward with a spring 64*e* into contact with the tapered surfaces of the pressing members 2L and 2M, so that the pressing members 2L and 2M are brought into contact with the two radiator bases 2D, and the radiator bases 2D are brought into contact with the second radiator base 2K. The tops of the radiator bases 2D are retained by the spring 64*e*.

Therefore, even if the parallelism between the collector lead 11*c* and the emitter lead 11*e* of the power semiconductor device 3 is low, the heat generated from the semiconductor chip 12T can be transferred from the radiator bases 2D to the radiator base 2K via the high-thermal-conductivity resin 50 and radiated from the radiating fins 2*k* to a cooling medium fed around the cooling fins 2*k*. The radiator base 2K is housed in the frame 58, as shown in FIG. 25, and a cooling medium is fed around the radiating fins 2*k*.

As has been described, the semiconductor unit of the embodiment is constructed such that the power semiconductor devices 3 are inserted into the hollow radiator bases 2D, where they are positioned and-then molded with the high-thermal-conductivity resin 50. The radiator bases 2D are retained in close contact with the second radiator base 2K. Therefore, even if the parallelism between the collector lead 11*c* and the emitter lead 11*e* is decreased, the heat generated from the power semiconductor devices 3 can be transferred to the radiator bases 2D and 2K via the high-thermal-conductivity resin 50 because the power semiconductor devices 3 are insert-molded in the hollow radiator base 2D with the high-thermal-conductivity resin 50, and the heat can be radiated from the radiating fins 2*k*, thus improving the cooling performance.

Referring then to FIG. 29, the eleventh embodiment will be described. This embodiment has two power semiconductor devices 3 in a radiator base 2Q. The elastic member 8 having an electrically insulating property, such as insulating rubber, is sandwiched between the DC negative-electrode-side wiring member 5 and the DC positive-electrode-side wiring member 6, which is placed in the U-shape-cross-section insulating first fixing jig 1. On both sides of the DC negative-electrode-side wiring member 5 and DC positive-electrode-side wiring member 6, two power semiconductor devices 3 are disposed.

The two power semiconductor devices 3, the DC negative-electrode-side wiring member 5, and the DC positive-electrode-side wiring member 6 are located in the bottomed hollow radiator base 2Q with a jig and then insert-molded with the high-thermal-conductivity resin 50. Radiating fins 2*q* are integrated on the outer lower surface of the radiator base 2Q. They are easily retained in contact with the radiator base 2Q by the elasticity of the elastic member 8.

Therefore, even if the parallelism between the collector lead 11*c* and the emitter lead 11*e* of the power semiconductor device 3 is low, the heat generated from the semiconductor chip 12T can be transferred to the radiator base 2Q via the high-thermal-conductivity resin 50, and can be radiated through the radiating fins 2*q* to a cooling medium fed around the radiating fins 2*q*. The radiator base 2Q is housed in the frame 58, as shown in FIG. 25, and a cooling medium is fed around the radiating fins 2*q*.

As has been described, the semiconductor unit of the embodiment is constructed such that the power semiconductor devices 3 are insert-molded with the high-thermal-conductivity resin 50. Therefore, even if the parallelism between the collector lead 11*c* and the emitter lead 11*e* is decreased, the heat generated from the power semiconductor devices 3 can be transferred to the radiator base 2Q via the high-thermal-conductivity resin 50 because the power semiconductor devices 3 are insert-molded in the hollow radiator base 2Q with the high-thermal-conductivity resin 50, and the heat can be radiated from the radiating fins 2*q*, thereby improving the cooling performance.

In the embodiments of FIGS. 26 to 29, the second radiator bases 2D, 2H, 2K, and 2 have radiating fins on the outside. Alternatively, the second radiator bases 2D, 2H, 2K, and 2 may have a cooling-medium channel therein.

Figure 30:
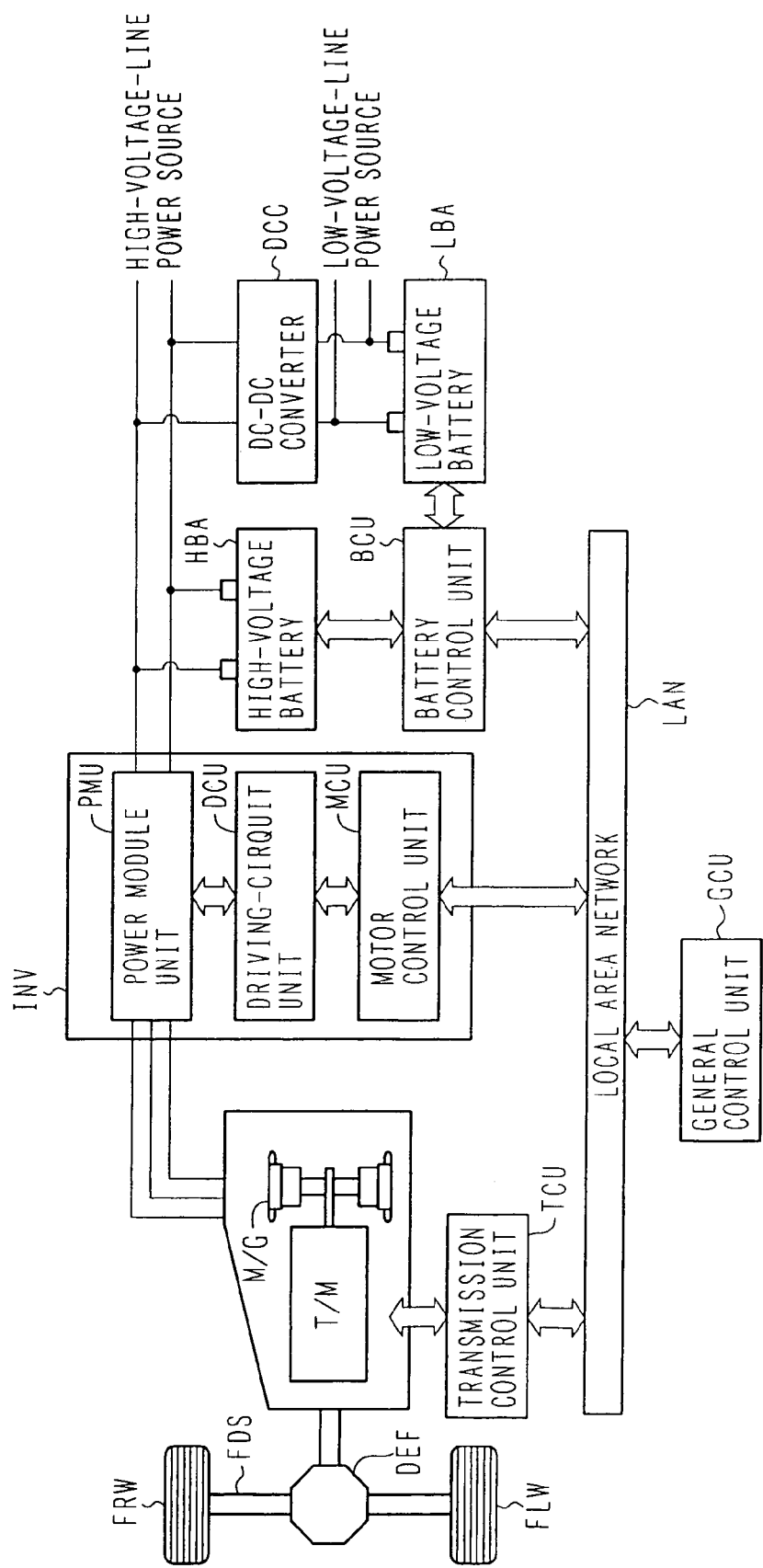
FIG. 30 is a system block diagram of an electric car equipped with the inverter INV according to the first embodiment.

Referring to FIG. 30, the structure of an electric car equipped with the inverter INV according to the embodiments will be described.

FIG. 30 is a system block diagram of the electric car equipped with the inverter INV according to the first embodiment of the invention.

The power system of the electric car of the embodiment is the hybrid electric car shown in FIG. 13 without the internal combustion engine. The structure without the internal combustion engine is the same as that of the hybrid electric car in FIG. 13. The operation of the electric car is the same as the driving operation of the hybrid electric car of FIG. 13 only by the motor generator of the hybrid electric car and the regenerating operation of the motor generator.

The structure of the semiconductor unit used in the inverter INV can be either that shown in FIGS. 1 to 7 or those shown in FIGS. 14 to 29.

The embodiment has the inverter INV equipped with one of the above-described semiconductor units as the controller of the motor generator M/G of the electric car. Therefore, a compact and reliable electric-car motor driving system can be provided at low price.

Figure 31:
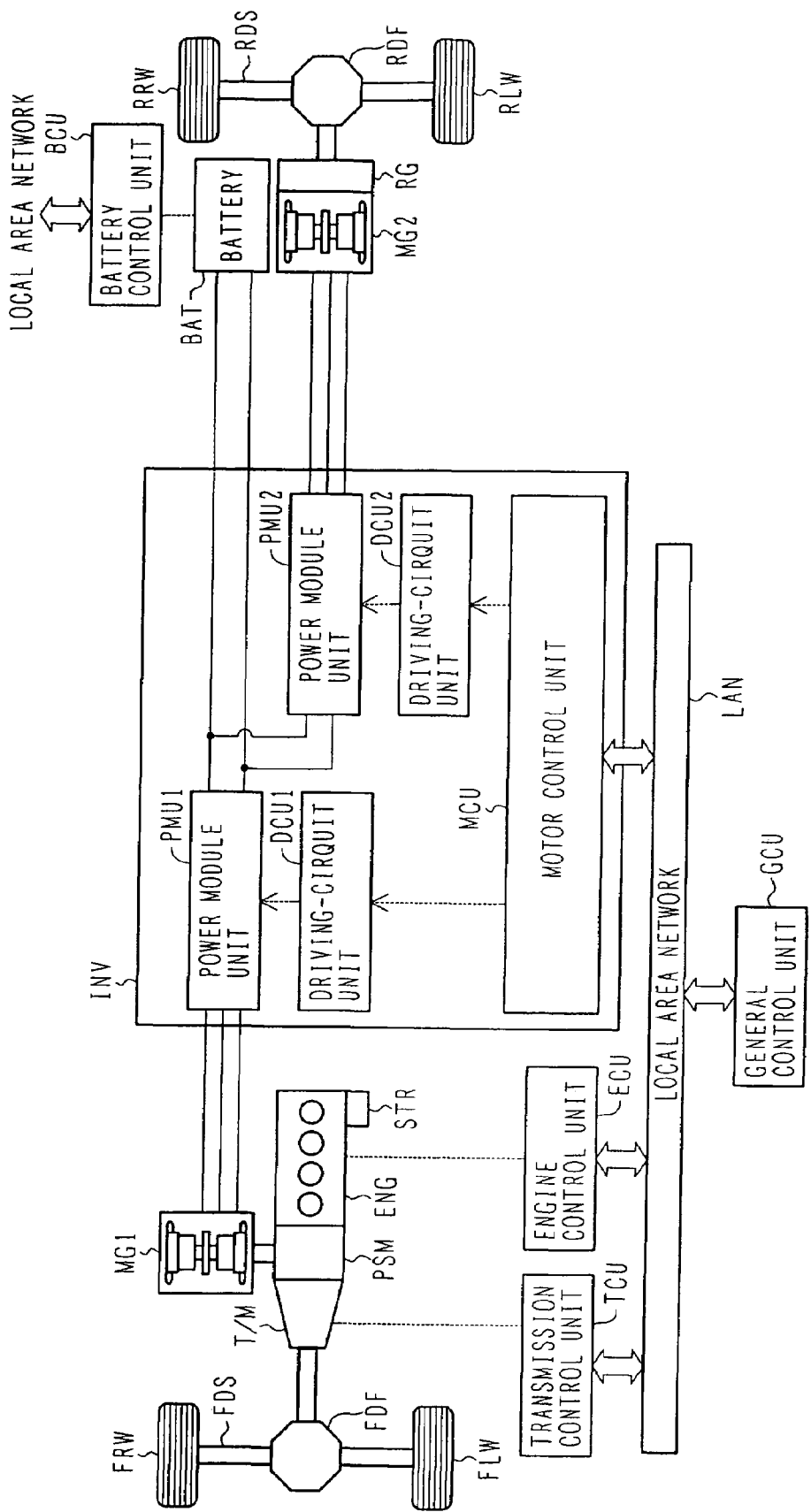
FIG. 31 is a system block diagram of a four-wheel-drive hybrid electric car equipped with the inverter INV according to the first embodiment.

Referring to FIG. 31, the structure of a four-wheel-drive hybrid electric car equipped with the inverter INV according to the first embodiment will be described.

FIG. 31 is a system block diagram of the four-wheel-drive hybrid electric car equipped with the inverter INV according to the first embodiment.

The hybrid electric car of the embodiment is of a four-wheel drive type in which the front wheels FLW and FRW are driven by the engine ENG which is an internal combustion engine and a motor generator MG1, and the rear wheels RLW and RRW are driven by a motor generator MG2. While this embodiment is described for the case in which the front wheels FLW and FRW are driven by the engine ENG and the motor generator MG1, and the rear wheels RLW and RRW are driven by the motor generator MG2, the front wheels FLW and FRW may be driven by the motor generator MG1, and the rear wheels RLW and RRW may be driven by the engine ENG and the motor generator MG2.

The front drive shafts FDS of the front wheels FLW and FRW are mechanically connected to the transmission T/M via a front differential FDF. The transmission T/M is mechanically connected to the motor generator MG1 and the engine ENG via a power split mechanism PSM. The power split mechanism PSM is responsible for combining and splitting rotation driving power. The stator winding of the motor generator MG1 is electrically connected to the AC side of the inverter INV. The inverter INV is a power converter that converts DC power to three-phase AC power, which controls the operation of the motor generator MG1. The DC side of the inverter INV is connected to the battery BAT.

The rear drive shafts RDS of the rear wheels RLW and RRW are mechanically connected to the motor generator MG2 via a rear differential RDF and a reduction gear RG. The stator winding of the motor generator MG2 is electrically connected to the AC side of the inverter INV. The inverter INV is used for both of the motor generators MG1 and MG2, and includes a power module unit PMU1 and a driving circuit unit DCU1 for the motor generator MG1, a power module unit PMU2 and a driving circuit unit DCU2 for the motor generator MG2 and the motor control unit MCU.

The engine ENG has a starter STR. The starter STR is a device for starting the engine ENG.

The engine control unit ECU calculates control values for operating the components of the engine ENG (a throttle value, a fuel injection value, etc.) according to the input signals from sensors and other controllers. The control values are output to the drivers of the components of the engine ENG as control signals. Thus, the operations of the components of the engine ENG are controlled.

The operation of the transmission T/M is controlled by the transmission control unit TCU. The transmission control unit TCU calculates control values for operating the transmission mechanism according to the input signals from sensors and other controllers. The control values are output to the driver of the transmission mechanism as control signals. Thus, the operation of the transmission mechanism of the transmission T/M is controlled.

The battery BAT is a high-voltage lithium-ion battery with a voltage of 200 V or more, whose charge and discharge and life are controlled by the battery control unit BCU. The battery control unit BCU receives the voltage and current of the battery BAT for controlling the charge and discharge and the life of the battery BAT. A low-voltage battery with a voltage of 12 V is also mounted (not shown), which is used as the power source of the control system, a radio, and lights.

The engine control unit ECU, the transmission control unit TCU, the motor control unit MCU, and the battery control unit BCU are electrically connected to one another on an on-vehicle local area network LAN, and are electrically connected to the general control unit GCU. This enables bidirectional signal transmission among the controllers, thus allowing mutual transmission of information and sharing of detected values.

The general control unit GCU outputs command signals to the controllers according to the driving condition of the vehicle. For example, the general control unit GCU calculates torque necessary for the vehicle in accordance with the degree of depression of the accelerator by the driver, and distributes the necessary torque into torque to be output by the engine ENG and torque to be output by the motor generator MG1 so as to improve the driving efficiency of the engine ENG. The distributed output torque of the engine ENG is output to the engine control unit ECU as an engine-torque command signal. The distributed output torque of the motor generator MG1 is output to the motor control unit MCU as a motor-torque command signal.

The structure of the semiconductor unit for use in the inverter INV may be any of that shown in FIGS. 1 to 7 and those shown in FIGS. 14 to 29.

As the motor generators MG1 and MG2, a permanent-magnet AC synchronizing motor generator is used which causes torque by the electromagnetic effect of a stator core having a stator winding and the permanent magnets of a rotor.

The operation of the hybrid electric car of the embodiment will then be described.

At the start and during low-speed traveling of the hybrid electric vehicle (in which the driving efficiency (fuel efficiency) of the engine ENG is low), the motor generator MG1 is used to drive the front wheels FLW and FRW. This embodiment is described for the case in which the front wheels FLW and FRW are driven by the motor generator MG1 at the start and low-speed traveling of the hybrid electric car; alternatively, the front wheels FLW and FRW may be driven by the motor generator MG1, and the rear wheels RLW and RRW may be driven by the motor generator MG2 (four-wheel driving may be made). The inverter INV is supplied with DC power from the battery BAT. The supplied DC power is converted to three-phase AC power by the inverter INV, and it is supplied to the stator winding of the motor generator MG1. Thus, the motor generator MG1 is driven to output torque. The torque is input to the transmission T/M via the power split mechanism PSM. The input torque is converted by the transmission T/M, and it is input to the front differential FDF. The input torque is split to the right and left by the front differential FDF into the right and left front drive shafts FDS. Thus, the front drive shafts FDS are rotated, thereby rotating the front wheels FLW and FRW.

During normal traveling of the hybrid electric car (on dry roads in which the driving efficiency (fuel efficiency) of the engine ENG is high), the front wheels FLW and FRW are driven by the engine ENG. Thus, the torque of the engine ENG is input to the transmission T/M via the power split mechanism PSM. The input torque is converted by the transmission T/M. The converted torque is transmitted to the front drive shafts FDS via the front differential FDF. Thus, the front wheels FLW and FRW are rotated. When the charge status of the battery BAT is sensed, wherein when the battery BAT needs to be charged, the torque of the engine ENG is sent to the motor generator MGI via the power split mechanism PSM to rotate the motor generator MG1. Thus, the motor generator MG1 acts as a generator, which causes three-phase AC power to be generated at the stator winding of the motor generator MG1. The three-phase AC power generated is converted to specified DC power by the inverter INV. The DC power obtained by the conversion is supplied to the battery BAT. The battery BAT is thus charged.

During four-wheel-drive traveling of the hybrid electric car (on low-μ roads such as snowy roads, in which the driving efficiency (fuel efficiency) of the engine ENG is high), the rear wheels RLW and RRW are driven by the motor generator MG2. The front wheels FLW and FRW are driven by the engine ENG as in the normal traveling. Since the charge amount of the battery BAT is decreased by the driving of the motor generator MGI, the motor generator MG1 is rotated by the torque of the engine ENG to charge the battery BAT. To drive the rear wheels RLW and RRW by the motor generator MG2, the inverter INV is supplied with DC power from the battery BAT. The supplied DC power is converted to three-phase AC power by the inverter INV, and it is supplied to the stator winding of the motor generator MG2. Thus, the motor generator MG2 is driven to output torque. The torque is reduced by the reduction gear RG and input to the rear differential RDF. The input torque is split to the right and left by the rear differential RDF into the right and left rear drive shafts RDS. Thus, the rear drive shafts RDS are rotated, thereby rotating the rear wheels RLW and RRW.

During acceleration of the hybrid electric car, the front wheels FLW and FRW are driven by the engine ENG and the motor generator MG1. This embodiment is described for the case in which the front wheels FLW and FRW are driven by the engine ENG and the motor generator MG1 at the acceleration of the hybrid electric car; alternatively, the front wheels FLW and FRW may be driven by the engine ENG and the motor generator MG1, and the rear wheels RLW and RRW may be driven by the motor generator MG2 (four-wheel driving may be made). The torque of the engine ENG and the motor generator MG1 is input to the transmission T/M via the power split mechanism PSM. The input torque is changed by the transmission T/M. The changed torque is transmitted to the front drive shafts FDS via the front differential FDF. Thus, the front wheels FLW and FRW are rotated.

During the regeneration of the hybrid electric car (during deceleration such as when the brake is applied or the accelerator is released or stopped), the torque of the front wheels FLW and FRW is transmitted to the motor generator MG1 via the front drive shafts FDS, the front differential FDF, the transmission T/M, and the power split mechanism PSM to rotate the motor generator MG1. Thus, the motor generator MG1 acts as a generator, so that three-phase AC power is generated at the stator winding of the motor generator MG1. The generated three-phase AC power is converted to specified DC power by the inverter INV. The DC power obtained by the conversion is supplied to the battery BAT. The battery BAT is thus charged. On the other hand, the torque of the rear wheels RLW and RRW is transmitted to the motor generator MG2 via the rear drive shaft RDS, the rear differential RDF, and the reduction gear RG to rotate the motor generator MG2. Thus, the motor generator MG2 acts as a generator, so that three-phase AC power is generated at the stator winding of the motor generator MG2. The generated three-phase AC power is converted to specified DC power by the inverter INV. The DC power obtained by the conversion is supplied to the battery BAT. The battery BAT is thus charged.

The embodiment allows the use of the inverters shown in FIGS. 14 to 29 as an inverter for use in the drive control unit of the motor generator MG1 and MG2 of four-wheel-drive hybrid electric cars, in addition to that shown in FIGS. 1 to 7. Therefore, a compact and reliable four-wheel-drive hybrid-electric-car motor driving system can be provided at low price.

The embodiment has been described using the four-wheel-drive hybrid electric car in which the motor generators MG1 and MG2 are driven by the power from the battery BAT. Another four-wheel-drive hybrid electric car is possible in which the front wheels (or the rear wheels) are driven by an engine, while the rear wheels (or the front wheels) are driven by a motor. In this case, in place of the motor generator MG1 and the battery BAT, it includes a generator driven by the engine ENG (a driving-only generator which can output DC power (50 V) higher than an auxiliary generator that outputs DC power for a 14-V on-vehicle auxiliary generator and whose output can be varied between 0 to 50 V), and supplies the output of the generator to the DC side of the inverter INV. The operation of the motor is controlled by the inverter INV to drive the rear wheels (or the front wheels). The inverter INV of the four-wheel-drive hybrid electric car may be any of those according to the first to seventh embodiments. For the motor that drives the rear wheels, a field-winding AC synchronizing motor generator is used which causes torque by the electromagnetic effect of a stator core having a stator winding and a Rundel rotor in which a field winding is wound around a pair of claw magnetic cores.

Figure 32:
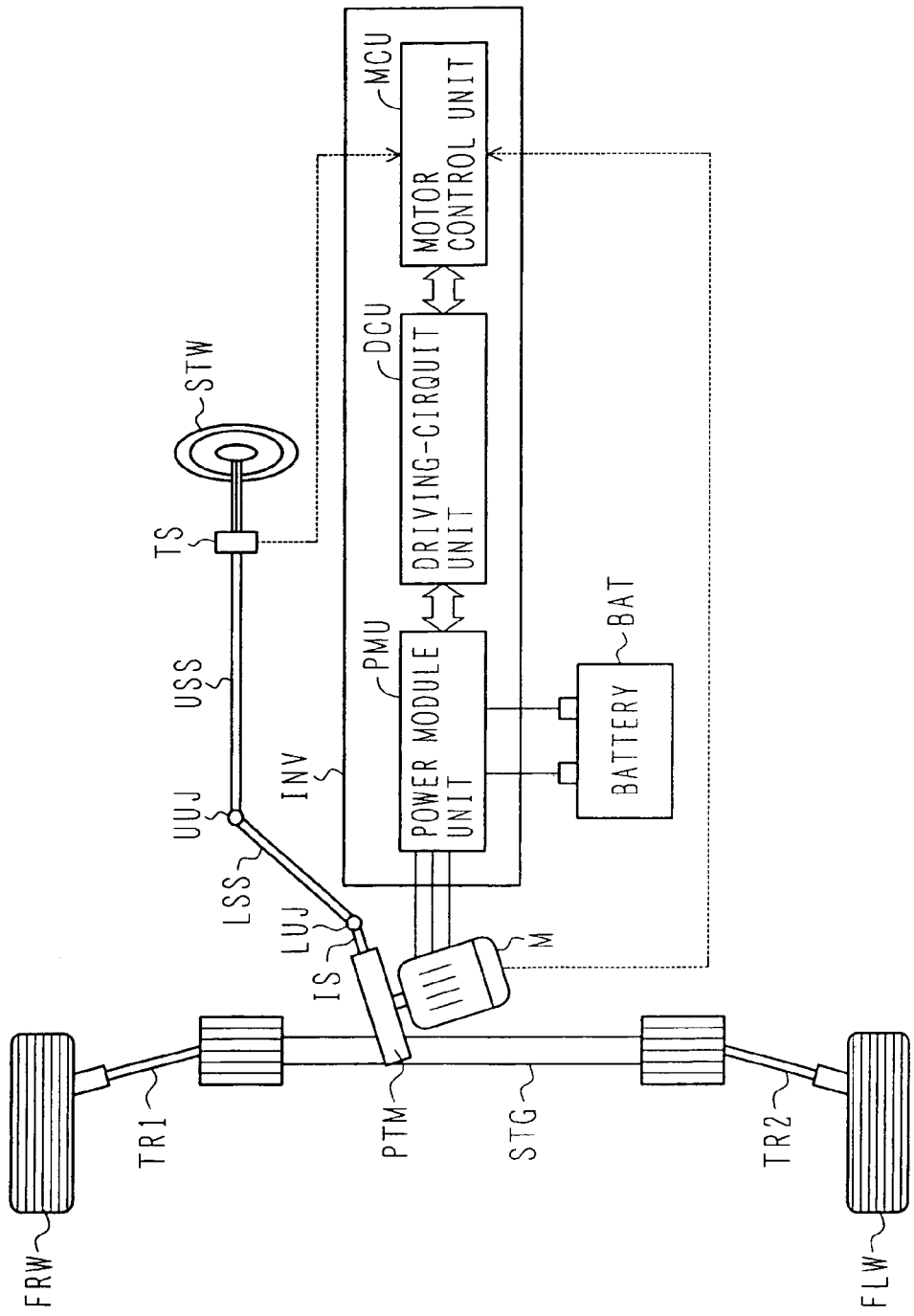
FIG. 32 is a system block diagram of an electric power steering system using the inverter INV according to the first embodiment.

Referring to FIG. 32, the structure of an electric power steering system using the inverter INV according to the first embodiment will be described.

FIG. 32 is a system block diagram of the electric power steering system using the inverter INV according to the first embodiment of the invention.

The electric power steering system of the embodiment (hereinafter, referred to as an EPS system) is a pinion EPS system (hereinafter, referred to as a P-EPS system), in which a pinion gear is assisted by an electric-power-steering motor M (hereinafter, referred to as an EPS motor M) disposed in the vicinity of a steering gear STG.

Examples of the EPS system are a column EPS system in which a column shaft is assisted by an EPS motor adjacent to the column shaft and a rack-cross EPS system in which a rack is assisted by an EPS motor adjacent to a steering gear. The power source of the P-EPS system and the structure of the actuator of the embodiment can also be applied to the EPS systems.

When a driver turns a steering wheel STW, its main steering force (turning force) is transmitted to the steering gear STG via an upper steering shaft USS, an upper universal joint UUJ, a lower steering shaft LSS, and a lower universal joint LUJ. To the steering gear STG, auxiliary steering force (turning force) output from the EPS motor M is transmitted.

The steering gear STG is a mechanism that converts the input main steering force and the auxiliary steering force to linear reciprocating force and transmits it to right and left tie rods TR1 and TR2, and is composed of a rack shaft (not shown) having a rack gear (not shown) and a pinion gear (not shown) having a pinion gear (not shown). The rack gear and the pinion gear are in engagement with each other at a power transmission PTM, where the turning force is converted to linear reciprocating force. The main steering force is transmitted to the pinion shaft via the input shaft IS of the power transmission PTM. The auxiliary steering force is transmitted to the pinion shaft via a reduction mechanism (not shown) of the power transmission PTM.

The steering force converted to linear reciprocating force by the steering gear STG is transmitted to the tie rods TR1 and TR2, from which it is transmitted to the right and left wheels WH1 and WH2. Thus the right and left wheels WH1 and WH2 are steered.

The upper steering shaft USS has a torque sensor TS. The torque sensor TS is for sensing the steering force (turning torque) applied to the steering wheel STW.

The EPS motor M is controlled by a controller. The EPS motor M and the controller constitute the actuator of the EPS system. The EPS system uses the on-vehicle battery BAT as power source. The controller is the inverter INV, which converts DC power supplied from the battery BAT to multiphase AC power according to the output of the torque sensor TS so that the torque output from the EPS motor M reaches target torque, and supplies it to the EPS motor M. The inverter INV is any of the inverters INV of the first to seventh embodiments. As the EPS motor M, a permanent-magnet AC synchronizing motor generator is used which causes torque by the electromagnetic effect of a stator core having a stator winding and the permanent magnets of a rotor.

According to the embodiment, as the controller for the EPS motor M of the EPS system, those shown in FIGS. 14 to 29 may be used in addition to that shown in FIGS. 1 to 7. Therefore, a compact and reliable EPS-system motor driving system can be provided at low price.

Figure 33:
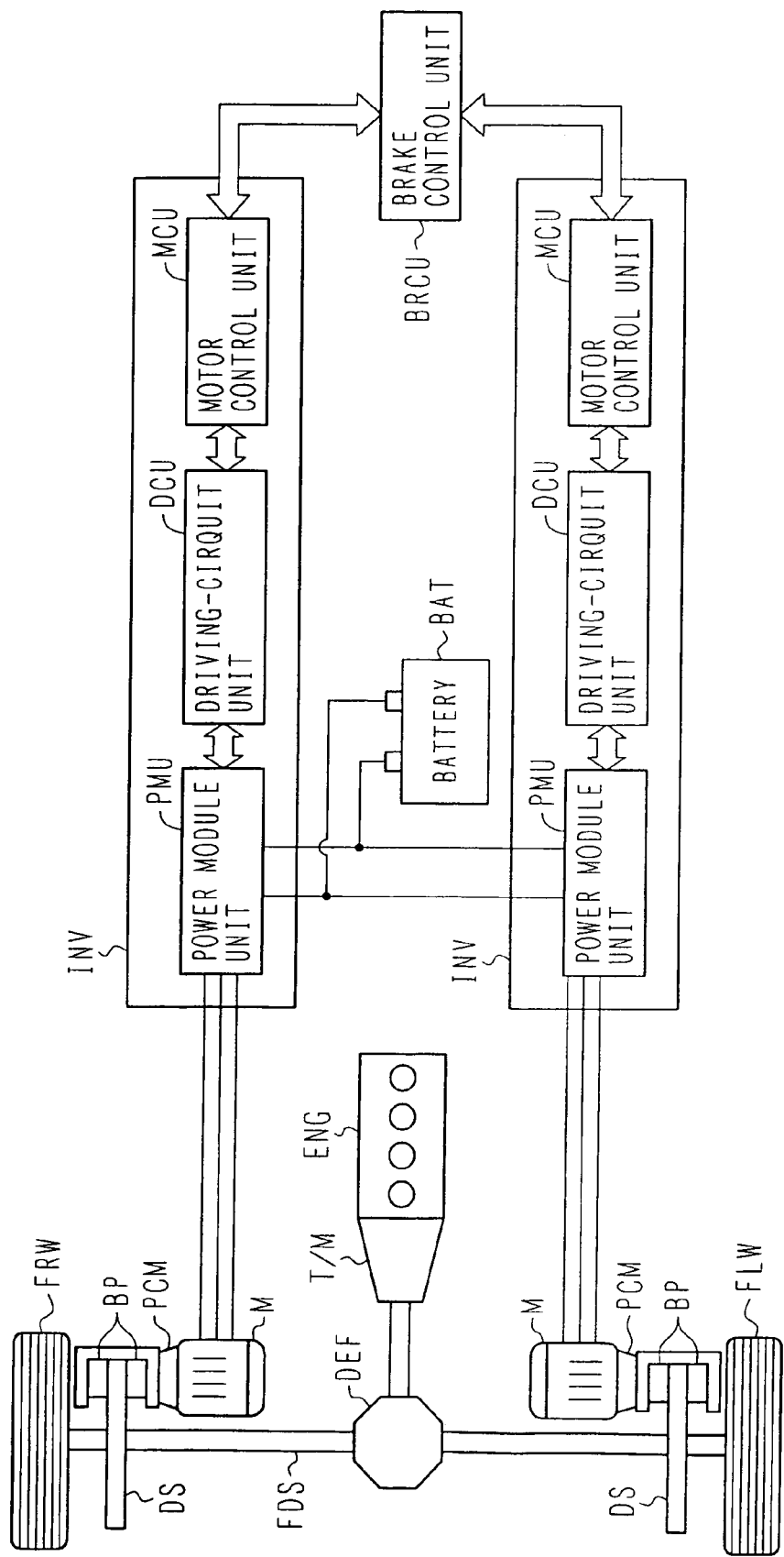
FIG. 33 is a system block diagram of an electric brake system using the inverter INV according to the first embodiment.

Referring to FIG. 33, the structure of an electric brake system using the inverter INV of the first embodiment will be described.

FIG. 33 is a system block diagram of the electric brake system using the inverter INV according to the first embodiment of the invention.

The electric brake system of the embodiment (hereinafter, referred to as an EB system) is a front-wheel drive car that transmits the driving force output from the engine ENG which is an internal combustion engine to the right and left front drive shafts FDS via the transmission T/M and the differential gear DEF to rotate the front wheels FLW and FRW, thereby driving the vehicle. The EB system of the embodiment is disposed at the right and left front wheels FRW and FLW.

The embodiment will be described taking an example in which the EB system is disposed at the front wheels. The EB system may be disposed either at the rear wheels or at the front and rear wheels.

The front drive shaft FDS have a disk rotor DS. The disk rotor DS rotates with the front drive shaft FDS. A brake pad BP which is axially movably supported by a carrier (not shown) is disposed on opposite sides of the disk rotor DS, The brake pad BP sandwiches the rotating surface of the disk rotor DS from both sides. Braking force is generated when the brake pad BP pushes the rotating surface of the disk rotor DS from both sides.

The brake pad BP is operated by the torque of a motor M. The torque of the motor M is converted to linear power by a power conversion mechanism PCM and applied to a piston (not shown) movably supported by a support mechanism (not shown) as driving force. When the piston is driven, the brake pad BP is operated to push the rotating surfaces of the disk rotor DS from both sides. As the motor M, a permanent-magnet AC synchronizing motor generator is used which causes torque by the electromagnetic effect of a stator core having a stator winding and the permanent magnets of a rotor.

The motor M is controlled by a controller. The motor M and the controller constitute the actuator of the EB system. The EB system uses the on-vehicle battery BAT as power source.

The controller is the inverter INV, which converts DC power supplied from the battery BAT to multiphase AC power according to the torque command from a brake control unit BRCU so that the torque output from the motor M reaches target torque, and supplies it to the motor M. The inverter INV is any of the inverters INV of the first to seventh embodiments.

The brake control unit BRCU calculates braking force necessary for the front wheels FLW and FRW from input signals such as the degree of depression of the brake pedal and the driving state of the vehicle, and converts the necessary braking force to the torque command values for the motor M, and outputs them to the inverter INV.

According to the embodiment, in addition to the controller shown in FIGS. 1 to 7, those shown in FIGS. 14 to 29 may be used as the controller for the motor M of the EB system. Therefore, a compact and reliable EB-system motor driving system can be provided at low price.

Figure 34:
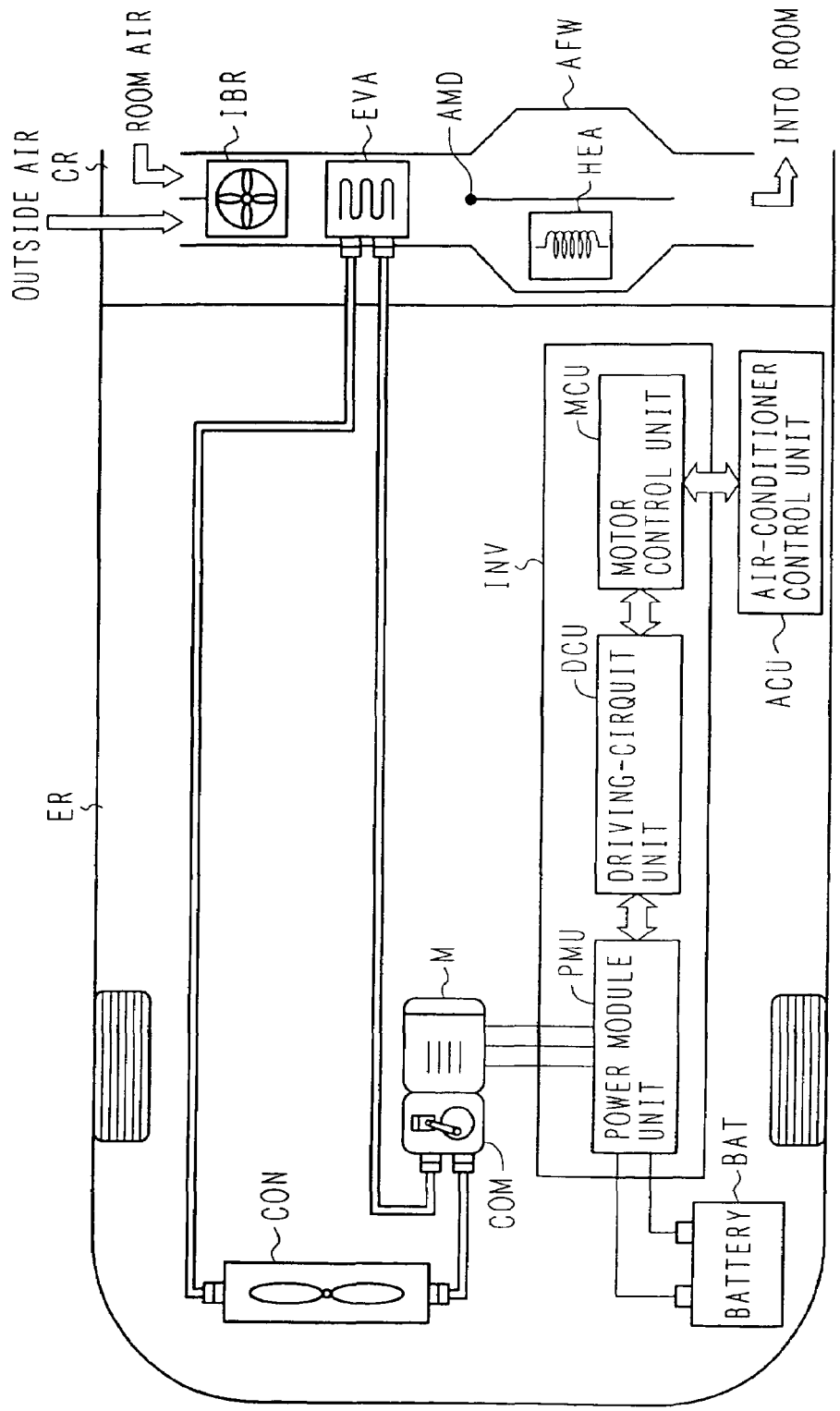
FIG. 34 is a system block diagram of an air conditioner using the inverter INV according to the first embodiment.

Referring to FIG. 34, an air conditioner (car air conditioner) using the inverter INV of the first embodiment will be described.

FIG. 34 is a system block diagram of the air conditioner using the inverter INV according to the first embodiment of the invention.

An engine room ER is provided at the fron of the vehicle body. The engine room ER has a cabin CR partitioned from the engine room ER. The engine room ER is a room for housing equipment necessary for driving the car and some of the components of the air conditioner. The cabin CR is a room for the driver who steers the handle in the driver seat and passengers who are seated in the passenger seat and rear seats. The cabin CR accommodates some of the components of the air conditioner (specifically, on the side adjacent to the engine room ER and under the dashboard).

The engine room ER is equipped with a compressor COM for compressing the cooling medium of the air conditioner. The compressor COM is integral with a motor M. Thus, the torque of the motor M is supplied (transmitted) to the compressor COM to rotate the compressor COM. The air-conditioning cooling medium compressed by the compressor COM is supplied to a condenser CON through a discharge pipe. The condenser CON cools the high-temperature high-pressure air-conditioning gas cooling medium compressed by the compressor COM with outside air into liquid.

The cabin CR accommodates an evaporator EVA that constitutes a cooling unit. The evaporator EVA is disposed in an air flow channel AFW, which evaporates the air-conditioning cooling medium supplied from the condenser CON through the pipe to cool the air. An intake blower IBR is disposed upstream from the evaporator EVA in the air flow channel AFW. The intake blower IBR blows outside air or room air into the air flow channel AFW. A heater unit HEA is disposed downstream from the evaporator EVA in the air flow channel AFW. The heater unit HEA heats the air cooled by the evaporator EVA.

When air (outside air or room air) is blown into the air flow channel AFW by the intake blower IBR, the air is cooled by the evaporator EVA. The cooled air flows to the heater unit HEA through the air flow channel AFW. An air mix door AMD is disposed between the evaporator EVA and the heater unit HEA in the air flow channel AFW. The air mix door AMD controls the amount of air flowing to the heater unit HEA and the amount of air that bypasses the heater unit HEA, thus diverting the air cooled by the evaporator EVA. The air diverted to the heater unit HEA is heated by the heater unit HEA and is mixed with the air that has bypasses the heater unit HEA. Thus, the temperature of the air to be blown into the cabin CR is controlled. The mixed air is blown into the cabin CR from any of plurality of nozzles provided in the cabin CR. Thus, the temperature of the interior of the cabin CR is controlled at a set temperature.

The air-conditioning cooling medium evaporated by the evaporator EVA is supplied to the compressor COM through an intake pipe, where it is compressed. The compressed air-conditioning cooling medium is supplied to the condenser CON through a discharge pipe, where it is liquefied. The liquefied air-conditioning cooling medium is supplied to the evaporator EVA through a pipe to be evaporated. The refrigerating cycle is repeated in the air conditioner. The discharge pipe, the pipe, and the intake pipe are made of metal or flexible hoses.

The motor M is controlled by a controller. The motor M and the controller constitute the actuator of the air condition system. The air condition system uses the on-vehicle battery BAT as power source. The controller is the inverter INV, which converts DC power supplied from the battery BAT to multiphase AC power according to the rotation-speed command from the air condition unit ACU so that the RPM of the motor M reaches target RPM, and supplies it to the motor M. The inverter INV is any of the inverters INV of the first to seventh embodiments.

The air condition unit ACU determines the activation and stop of the compressor COM from the input signals such as the temperature set by the driver and the temperature of the cabin CR, and outputs a rotation speed necessary to operate the compressor COM to the inverter INV as a command value according to the determination.

The embodiment allows the use of the controllers shown in FIGS. 14 to 29, in addition to that shown in FIGS. 1 to 7, as the controller for the motor M of the air condition system. Therefore, a compact and reliable air-condition-system motor driving system can be provided at low price.

While the foregoing embodiments have been described taking a battery as an example of DC power supply, a fuel cell may also be used.

What is claimed is:

1. A semiconductor unit comprising:
a semiconductor device including a semiconductor chip, leads electrically connected to electrodes of said semiconductor chip and high thermal-conductivity resin for integrally molding said semiconductor chip and said leads; and
a hollow radiator base for housing said semiconductor device; wherein,
said semiconductor device is supported at inside walls of said radiator base;
said high thermal-conductivity resin is present between said semiconductor chip and said radiator base; and
heat generated from said semiconductor chip and said leads is transmitted to inside walls of said radiator base through said high thermal-conductivity resin.

2. The semiconductor unit according to claim 1, wherein said radiator base provides a cooling-medium channel therein.

3. A semiconductor unit comprising:
a semiconductor device including a semiconductor chip, leads electrically connected to electrodes of said semiconductor chip and high thermal-conductivity resin intearally molding said semiconductor chin and said leads; and
a hollow radiator base for housing said semiconductor device; wherein
said semiconductor device is supported at inside walls of said radiator base;
said hiah thermal-conductivity resin is present between said semiconductor chip and said radiator base;
heat generated from said semiconductor chip and said leads is transmitted to inside walls of said radiator base through said high thermal-conductivity resin; and
said radiator base provides radiating fins on the outside.

4. A semiconductor unit comprising:
a semiconductor device including a semiconductor chip, leads electrically connected to electrodes of said semiconductor chip and high thermal-conductivity resin integrally molding said semiconductor chip and said leads; and
a hollow radiator base for housing said semiconductor device; wherein
said semiconductor device is supported at inside walls of said radiator base;
said high thermal-conductivity resin is present between said semiconductor chip and said radiator base;
heat generated from said semiconductor chip and said leads is transmitted to inside walls of said radiator base through said high thermal-conductivity resin; and
two semiconductor devices are housed in said radiator base;
said semiconductor unit further comprises a bus bar having an electrically conductive plate covered with an electrically insulating material on its outside; and
a first one of said semiconductor devices molded with high-thermal-conductivity resin, said bus bar covered with electrically insulating material, and a second one of said semiconductor devices molded with high-thermal-conductivity resin in layers are housed in said radiator base.

5. A semiconductor unit comprising:
a semiconductor device including a semiconductor chip, leads electrically connected to electrodes of said semiconductor chip and high thermal-conductivity resin intearally molding said semiconductor chip and said leads; and
a hollow radiator base for housing said semiconductor device; wherein
said semiconductor device is supported at inside walls of said radiator base;
said high thermal-conductivity resin is present between said semiconductor chip and said radiator base;
heat generated from said semiconductor chip and said leads is transmitted to inside walls of said radiator base through said high thermal-conductivity resin; and
said semiconductor unit further comprises,
a second radiator base in which said radiator base is housed; and
a pressing member for pushing said radiator base against the inner wall of said second radiator base, with said radiator base housed therein, and bringing the outer wall of said radiator base into contact with the inner wall of said second radiator base and the outer wall of said radiator base.

6. The semiconductor unit according to claim 5, wherein:
said radiator base is constructed such that the angle $\theta 1$ formed by the bottom and one side is smaller than 90°; and
an angle formed by the inner bottom of said second radiator base and one inner side is equal to the angle $\theta 1$.

7. A semiconductor unit comprising:
a semiconductor device including a semiconductor chip, leads electrically connected to electrodes of said semiconductor chip and high thermal-conductivity resin integrally moldina said semiconductor chip and said leads; and a hollow radiator base for housing said semiconductor device; wherein said semiconductor device is supported at inside walls of said radiator base;

said high thermal-conductivity resin is present between said semiconductor chip and said radiator base;

heat generated from said semiconductor chip and said leads is transmitted to inside walls of said radiator base through said high thermal-conductivity resin;

said leads include a first platy lead in face connection with a surface electrode of said semiconductor chip with a bonding material, a second platy lead in face connection with a back electrode of said semiconductor chip with a bonding material, and a third lead in connection with another electrode of said semiconductor chip by wire bonding; and said first and second leads are made of an electrically conductive material with high thermal conductivity.

8. A semiconductor unit comprising:

a semiconductor device including a semiconductor chip, leads electrically connected to electrodes of said semiconductor chip and high thermal-conductivity resin integrally molding said semiconductor chip and said leads; and a hollow radiator base for housing said semiconductor device; wherein said semiconductor device is supported at inside walls of said radiator base;

said high thermal-conductivity resin is present between said semiconductor chip and said radiator base;

heat generated from said semiconductor chip and said leads is transmitted to inside walls of said radiator base through said high thermal-conductivity resin;

said radiator base provides a cooling-medium channel therein; and said semiconductor unit further comprises thermal-conductivity projections having a specified thickness on the surface of said first and second leads facing the inner side of said radiator base.

9. A semiconductor unit comprising:

a semiconductor device including a semiconductor chip, leads electrically connected to electrodes of said semiconductor chip and high thermal-conductivity resin integrally molding said semiconductor chip and said leads; and a hollow radiator base for housing said semiconductor device; wherein said semiconductor device is supported at inside walls of said radiator base;

said high thermal-conductivity resin is present between said semiconductor chip and said radiator base;

heat generated from said semiconductor chip and said leads is transmitted to inside walls of said radiator base through said high thermal-conductivity resin;

said semiconductor unit further comprises an electrically insulating support jig placed between the interior of said radiator base and said semiconductor device;

said support jig retains said semiconductor device in said radiator base with a specified distance between said semiconductor device and said radiator base; and a clearance between said semiconductor device and said radiator base is filled with said high-thermal-conductivity resin.

10. A semiconductor unit comprising:

a semiconductor device including a semiconductor chip, leads electrically connected to electrodes of said semiconductor chip and high thermal-conductivity resin integrally molding said semiconductor chip and said leads; and a hollow radiator base for housing said semiconductor device; wherein said semiconductor device is supported at inside walls of said radiator base;

said high thermal-conductivity resin is present between said semiconductor chip and said radiator base;

heat generated from said semiconductor chip and said leads is transmitted to inside walls of said radiator base through said high thermal-conductivity resin;

said radiator base has recesses formed therein; and said recesses are filled with said high-thermal-conductivity resin.

11. A semiconductor unit comprising:

a semiconductor device including a semiconductor chip, leads electrically connected to electrodes of said semiconductor chip and high thermal-conductivity resin integrally molding said semiconductor chip and said leads; and a hollow radiator base for housing said semiconductor device; wherein said semiconductor device is supported at inside walls of said radiator base;

said high thermal-conductivity resin is present between said semiconductor chip and said radiator base;

heat generated from said semiconductor chip and said leads is transmitted to inside walls of said radiator base through said high thermal-conductivity resin; and said radiator base is a bottomed hollow body.

12. The semiconductor unit according to claim 11, wherein said radiator base has a through hole for mounting said radiator base to another radiator base.

13. A semiconductor unit comprising:

a semiconductor device, and a radiator base for radiating the heat generated from said semiconductor device, wherein said semiconductor device includes a semiconductor chip and leads electrically connected to electrodes of said semiconductor chip;

said radiator base is a hollow body, inwhich said semiconductor device can be housed and molded with high-thermal-conductivity resin, said radiator base having a cooling-medium channel therein or radiating fins on the outside; and said high-thermal-conductivity resin has an electrical insulating property.

14. The semiconductor unit according to claim 13, wherein said leads include a first platy lead in face connection with a surface electrode of said semiconductor chip with a bonding material; a second platy lead in face connection with a back electrode of said semiconductor chip with a bonding material; and a third lead in connection with another electrode of said semiconductor chip by wire bonding, wherein said first and second leads are made of a material with electrical conductivity and high thermal conductivity.

15. A power conversion system for converting an electric power supplied from a power source to specified power and supplies it to a power receiver, the system comprising:
 a converter electrically connected between said power source and said power receiver, and converting the power supplied from the power source to specified power and supplying it to the power receiver; and
 a controller for controlling the operation of said converter, wherein
 said converter converts power by controlling the electrical connection of an electrical device mounted to an electric-circuit module using said semiconductor unit as a switching device, said semiconductor unit including a semiconductor chip and leads electrically connected to electrodes of said semiconductor chip; and a hollow radiator base that houses said semiconductor device molded with high-thermal-conductivity resin having an electrical insulating property; and
 said controller outputs a signal for controlling the electrical connection of said electrical device to said electric-circuit module in response to an external signal.

16. An on-vehicle electrical system for generating electric power for driving a vehicle or an on-vehicle electrical device with the power of an on-vehicle power source, said electrical system comprising:
 an electrical device for generating the electric power; and
 a controller for controlling the operation of said electrical device, wherein
 said controller is a power converter which converts the power supplied from the on-vehicle power source to specified power and supplies it to said electrical device, wherein
 said power converter includes:
 a converter electrically connected between said on-vehicle power source and said electrical device, and converting the power supplied from the on-vehicle power source to specified power and supplying it to said electrical device; and
 a controller that controls the operation of said converter, wherein said converter converts power by controlling the electrical connection of an electrical device mounted to an electric-circuit module using said semiconductor unit as a switching device, said semiconductor unit including a semiconductor chip and leads electrically connected to electrodes of said semiconductor chip; and a hollow radiator base that houses said semiconductor device molded with high-thermal-conductivity resin having an electrical insulating property; and
 said controller outputs a signal for controlling the electrical connection of said electrical device to said electric-circuit module in response to an external signal.

17. The semiconductor unit according to claim 1, further comprising a fin formed at an outer wall of said hollow radiator base, wherein the outer wall at which said fin is formed contacts directly with cooling medium.

18. The semiconductor unit according to claim 1, comprising a plurality of said semiconductor devices, wherein said hollow radiator base houses said plurality of semiconductor devices, and is integrated.

\* \* \* \* \*